US010838811B1

(12) United States Patent
Kuo

(10) Patent No.: US 10,838,811 B1
(45) Date of Patent: Nov. 17, 2020

(54) NON-VOLATILE MEMORY WRITE METHOD USING DATA PROTECTION WITH AID OF PRE-CALCULATION INFORMATION ROTATION, AND ASSOCIATED APPARATUS

(71) Applicant: Silicon Motion Inc., Hsinchu County (TW)

(72) Inventor: Shiuan-Hao Kuo, New Taipei (TW)

(73) Assignee: Silicon Motion, Inc., Hsinchu County (TW)

( * ) Notice: Subject to any disclaimer, the term of this patent is extended or adjusted under 35 U.S.C. 154(b) by 0 days.

(21) Appl. No.: 16/541,103

(22) Filed: Aug. 14, 2019

(51) Int. Cl.
*G06F 11/10* (2006.01)
*G06F 3/06* (2006.01)
*G11C 29/52* (2006.01)

(52) U.S. Cl.
CPC ........ *G06F 11/1068* (2013.01); *G06F 3/0604* (2013.01); *G06F 3/0659* (2013.01); *G06F 3/0679* (2013.01); *G11C 29/52* (2013.01)

(58) Field of Classification Search
CPC .. G06F 11/1068; G06F 3/0604; G06F 3/0659; G06F 3/0679; G11C 29/52
See application file for complete search history.

(56) References Cited

U.S. PATENT DOCUMENTS

| | | | |
|---|---|---|---|
| 9,122,625 B1* | 9/2015 | Lu | G06F 11/1072 |
| 2009/0287956 A1* | 11/2009 | Flynn | G06F 11/1008 |
| | | | 714/6.12 |
| 2010/0293439 A1* | 11/2010 | Flynn | G06F 11/108 |
| | | | 714/763 |
| 2010/0293440 A1* | 11/2010 | Thatcher | G06F 11/1092 |
| | | | 714/764 |
| 2016/0054920 A1* | 2/2016 | Patterson, III | G06F 3/0683 |
| | | | 714/766 |
| 2016/0054939 A1* | 2/2016 | Wang, III | G06F 11/1076 |
| | | | 711/154 |
| 2016/0055054 A1* | 2/2016 | Patterson, III | G06F 3/0619 |
| | | | 714/6.2 |
| 2018/0076828 A1* | 3/2018 | Kanno | G11C 7/1006 |

OTHER PUBLICATIONS

T. Huang, "Cluster Error Correction for Real-Time Channels by Unbound Rotation of Two-Dimensional Parity-Check Codes," in IEEE Communications Letters, vol. 19, No. 6, pp. 917-920, Jun. 2015. (Year: 2015).*

* cited by examiner

*Primary Examiner* — Kyle Vallecillo
(74) *Attorney, Agent, or Firm* — Winston Hsu

(57) ABSTRACT

A non-volatile (NV) memory write method using data protection with aid of pre-calculation information rotation, and associated apparatus such as memory device, controller and encoding circuit thereof are provided. The NV memory write method may include: receiving a write command and data from a host device; obtaining at least one portion of data to be a plurality of messages, to generate a plurality of parity codes through pre-calculation information rotation type encoding, wherein regarding a message: starting encoding a message to calculate a partial parity code according to the message and a transpose matrix of a part-one matrix within a parity check matrix; loading a partial matrix of an inverse matrix of a part-two matrix within the parity check matrix from a storage circuit; applying the partial matrix and its rotated version(s) generated through rotation control to generate and output a corresponding parity code; and writing into the NV memory.

20 Claims, 10 Drawing Sheets

NON-VOLATILE MEMORY WRITE METHOD USING DATA PROTECTION WITH AID OF PRE-CALCULATION INFORMATION ROTATION, AND ASSOCIATED APPARATUS

BACKGROUND OF THE INVENTION

1. Field of the Invention

The present invention is related to memory control, and more particularly, to a non-volatile (NV) memory write method using data protection with aid of pre-calculation information rotation, and associated apparatus such as a memory device, a controller of the memory device, and an encoding circuit of the controller.

2. Description of the Prior Art

Developments in memory technology have enabled the wide application of various portable and non-portable memory devices (e.g. memory cards conforming to the SD/MMC, CF, MS, XD or UFS specifications, solid state drives (SSDs), embedded storage devices conforming to the UFS or EMMC specifications, etc.). Improving access control of memories in these memory devices remains an issue to be solved in the art.

NAND flash memories may comprise single level cell (SLC) and multiple level cell (MLC) flash memories. In an SLC flash memory, each transistor used as a memory cell may have either of two electrical charge values respectively corresponding to logical values 0 and 1. In comparison, the storage ability of each transistor used as a memory cell in an MLC flash memory may be fully utilized. The transistor in the MLC flash memory can be driven by a voltage higher than that in the SLC flash memory, and different voltage levels can be utilized to record information of at least two bits (e.g. 00, 01, 11, or 10). In theory, the recording density of the MLC flash memory may reach at least twice the recording density of the SLC flash memory, and is therefore preferred by manufacturers of NAND flash memories.

The lower cost and larger capacity of the MLC flash memory means it is more likely to be applied in memory devices than an SLC flash memory. The MLC flash memory does have instability issues, however. To ensure that access control of the flash memory in the memory device meets required specifications, a controller of the flash memory may be equipped with some management mechanisms for properly managing data access.

Even memory devices with the above management mechanisms may have certain deficiencies, however. For example, during a certain type of encoding in error correction code (ECC) processing, the calculation of the associated matrix multiplication may rely on pre-calculated information to prevent an encoding delay, and the pre-calculated information may require certain amount of storage space within the hardware architecture of a controller integrated circuit (IC), where the amount of storage space may correspond to a multiple of the parity length. However, some side effects may be introduced. For example, as the controller IC may need to support various ECC processing specifications as required by different memory device manufacturers, the internal storage space of the controller IC may be forcibly increased, which may cause the associate costs to be increased. Hence, there is a need for a novel method and associated architecture to improve the performance of the memory device without introducing a side effect or in a way that is less likely to introduce a side effect.

SUMMARY OF THE INVENTION

It is an objective of the present invention to provide a non-volatile (NV) memory write method using data protection with aid of pre-calculation information rotation, and associated apparatus such as a memory device, a controller of the memory device, and an encoding circuit of the controller, in order to solve the above-mentioned problems.

It is another objective of the present invention to provide an NV memory write method using data protection with aid of pre-calculation information rotation, and associated apparatus such as a memory device, a controller of the memory device, and an encoding circuit of the controller, in order to achieve optimal performance of the memory device.

At least one embodiment of the present invention provides an NV memory write method using data protection with aid of pre-calculation information rotation, where the NV memory write method is applicable to a memory controller of a memory device. The memory device may comprise the memory controller and the NV memory, and the NV memory may comprise at least one NV memory element (e.g. one or more NV memory elements). The NV memory write method may comprise: utilizing the memory controller to receive a write command and data corresponding to the write command from a host device; utilizing an encoding circuit of the memory controller to obtain at least one portion of data within the data corresponding to the write command to be a plurality of messages of an error correction code (ECC) chunk, to generate a plurality of parity codes of the ECC chunk according to the plurality of messages through pre-calculation information rotation type encoding, wherein the plurality of parity codes correspond to the plurality of messages, respectively, for protecting the plurality of messages, respectively; and utilizing the memory controller to write the ECC chunk comprising the plurality of messages and the plurality of parity codes into the NV memory. For example, regarding any message within the plurality of messages, the pre-calculation information rotation type encoding may comprise: after at least one portion of the message is sent into the encoding circuit, starting encoding the message to calculate a partial parity code according to the message and a transpose matrix of a part-one matrix within a parity check matrix, wherein the part-one matrix is a first sub-matrix of the parity check matrix; after at least one portion of the partial parity code is generated, loading a partial matrix of an inverse matrix of a part-two matrix within the parity check matrix from a storage circuit within the encoding circuit, wherein the part-two matrix is a second sub-matrix of the parity check matrix, and the partial matrix of the inverse matrix of the part-two matrix is stored as pre-calculation information in the storage circuit; applying the partial matrix of the inverse matrix of the part-two matrix to the partial parity code to generate a first sub-parity code of a parity code corresponding to the message, and outputting the first sub-parity code of the parity code as a beginning portion of the parity code; performing rotation control regarding the pre-calculation information to load at least one rotated version of the partial matrix of the inverse matrix of the part-two matrix; and applying said at least one rotated version of the partial matrix of the inverse matrix of the part-two matrix to the partial parity code to generate at least one subsequent sub-parity code of the parity code corresponding to the message, and outputting said at least one subsequent sub-parity code of the parity code as at least one subsequent portion of the parity code.

In addition to the above method, the present invention also provides a memory device, and the memory device comprises a NV memory and a memory controller. The NV memory is arranged to store information, wherein the NV memory may comprise at least one NV memory element (e.g. one or more NV memory elements). The memory controller is coupled to the NV memory, and the memory controller is arranged to control operations of the memory device. In addition, the memory controller comprises a processing circuit, and the processing circuit is arranged to control the memory controller according to a plurality of host commands from a host device to allow the host device to access the NV memory through the memory controller. The memory controller further comprises a control logic circuit that is coupled to the processing circuit and arranged to control the NV memory. More particularly, the control logic circuit comprises an encoding circuit that is arranged to perform encoding with aid of pre-calculation information rotation for data protection during accessing the NV memory. Additionally, the memory controller receives a write command and data corresponding to the write command from the host device; the encoding circuit obtains at least one portion of data within the data corresponding to the write command to be a plurality of messages of an error correction code (ECC) chunk, to generate a plurality of parity codes of the ECC chunk according to the plurality of messages through pre-calculation information rotation type encoding, wherein the plurality of parity codes correspond to the plurality of messages, respectively, for protecting the plurality of messages, respectively; and the memory controller writes the ECC chunk comprising the plurality of messages and the plurality of parity codes into the NV memory. For example, regarding any message within the plurality of messages, operations of the pre-calculation information rotation type encoding may comprise: after at least one portion of the message is sent into the encoding circuit, the encoding circuit starts encoding the message to calculate a partial parity code according to the message and a transpose matrix of a part-one matrix within a parity check matrix, wherein the part-one matrix is a first sub-matrix of the parity check matrix; after at least one portion of the partial parity code is generated, the encoding circuit loads a partial matrix of an inverse matrix of a part-two matrix within the parity check matrix from a storage circuit within the encoding circuit, wherein the part-two matrix is a second sub-matrix of the parity check matrix, and the partial matrix of the inverse matrix of the part-two matrix is stored as pre-calculation information in the storage circuit; the encoding circuit applies the partial matrix of the inverse matrix of the part-two matrix to the partial parity code to generate a first sub-parity code of a parity code corresponding to the message, and outputs the first sub-parity code of the parity code as a beginning portion of the parity code; the encoding circuit performs rotation control regarding the pre-calculation information to load at least one rotated version of the partial matrix of the inverse matrix of the part-two matrix; and the encoding circuit applies said at least one rotated version of the partial matrix of the inverse matrix of the part-two matrix to the partial parity code to generate at least one subsequent sub-parity code of the parity code corresponding to the message, and outputs said at least one subsequent sub-parity code of the parity code as at least one subsequent portion of the parity code.

In addition to the above method, the present invention also provides a memory controller of a memory device, where the memory device comprises the memory controller and an NV memory. The NV memory may comprise at least one NV memory element (e.g. one or more NV memory elements). In addition, the memory controller comprises a processing circuit, and the processing circuit is arranged to control the memory controller according to a plurality of host commands from a host device, to allow the host device to access the NV memory through the memory controller. The memory controller further comprises a control logic circuit that is coupled to the processing circuit and arranged to control the NV memory. More particularly, the control logic circuit comprises an encoding circuit that is arranged to perform encoding with aid of pre-calculation information rotation for data protection during accessing the NV memory. Additionally, the memory controller receives a write command and data corresponding to the write command from the host device; the encoding circuit obtains at least one portion of data within the data corresponding to the write command to be a plurality of messages of an error correction code (ECC) chunk, to generate a plurality of parity codes of the ECC chunk according to the plurality of messages through pre-calculation information rotation type encoding, wherein the plurality of parity codes correspond to the plurality of messages, respectively, for protecting the plurality of messages, respectively; and the memory controller writes the ECC chunk comprising the plurality of messages and the plurality of parity codes into the NV memory. For example, regarding any message within the plurality of messages, operations of the pre-calculation information rotation type encoding may comprise: after at least one portion of the message is sent into the encoding circuit, the encoding circuit starts encoding the message to calculate a partial parity code according to the message and a transpose matrix of a part-one matrix within a parity check matrix, wherein the part-one matrix is a first sub-matrix of the parity check matrix; after at least one portion of the partial parity code is generated, the encoding circuit loads a partial matrix of an inverse matrix of a part-two matrix within the parity check matrix from a storage circuit within the encoding circuit, wherein the part-two matrix is a second sub-matrix of the parity check matrix, and the partial matrix of the inverse matrix of the part-two matrix is stored as pre-calculation information in the storage circuit; the encoding circuit applies the partial matrix of the inverse matrix of the part-two matrix to the partial parity code to generate a first sub-parity code of a parity code corresponding to the message, and outputs the first sub-parity code of the parity code as a beginning portion of the parity code; the encoding circuit performs rotation control regarding the pre-calculation information to load at least one rotated version of the partial matrix of the inverse matrix of the part-two matrix; and the encoding circuit applies said at least one rotated version of the partial matrix of the inverse matrix of the part-two matrix to the partial parity code to generate at least one subsequent sub-parity code of the parity code corresponding to the message, and outputs said at least one subsequent sub-parity code of the parity code as at least one subsequent portion of the parity code.

In addition to the above method, the present invention also provides an encoding circuit of a memory controller of a memory device, where the memory device comprises the memory controller and an NV memory, the memory controller comprises the encoding circuit, and the NV memory comprises at least one NV memory element (e.g. one or more NV memory elements). The encoding circuit comprises a barrel shifter and a multiplication circuit coupled to the barrel shifter, and the multiplication circuit comprises a circulant convolution control unit, a plurality of circulant convolution circuits coupled to the circulant convolution control unit, and a combining circuit coupled to the plurality of circulant convolution circuits, where the circulant convolution control unit comprises a storage circuit and a rotation control circuit coupled to the storage circuit. The barrel shifter is arranged to perform partial parity code calculation. For example, the memory controller receives a write command and data corresponding to the write command from a host device, and the encoding circuit obtains at least one portion of data within the data corresponding to the write command to be a plurality of messages of an error correction code (ECC) chunk, to generate a plurality of parity codes of the ECC chunk according to the plurality of messages through pre-calculation information rotation type encoding, wherein the plurality of parity codes correspond to the plurality of messages, respectively, for protecting the plurality of messages, respectively. After at least one portion of any message within the plurality of messages is sent into the encoding circuit, the barrel shifter calculates a partial parity code according to the message and a transpose matrix of a part-one matrix within a parity check matrix, wherein the part-one matrix is a first sub-matrix of the parity check matrix. In addition, the multiplication circuit is arranged to perform multiplication to generate a parity code corresponding to the message. For example, the storage circuit is arranged to store pre-calculation information, the rotation control circuit is arranged to control the encoding circuit to perform encoding with aid of pre-calculation information rotation for data protection during accessing the NV memory, and the plurality of circulant convolution circuits is arranged to perform circulant convolution. After at least one portion of the partial parity code is generated, the rotation control circuit loads a partial matrix of an inverse matrix of a part-two matrix within the parity check matrix from the storage circuit, to allow the plurality of circulant convolution circuits to apply the partial matrix of the inverse matrix of the part-two matrix to the partial parity code to generate a first sub-parity code of the parity code corresponding to the message, and performs rotation control regarding the pre-calculation information to load at least one rotated version of the partial matrix of the inverse matrix of the part-two matrix, to allow the plurality of circulant convolution circuits to apply said at least one rotated version of the partial matrix of the inverse matrix of the part-two matrix to the partial parity code to generate at least one subsequent sub-parity code of the parity code corresponding to the message, wherein the part-two matrix is a second sub-matrix of the parity check matrix, and the partial matrix of the inverse matrix of the part-two matrix is stored as the pre-calculation information in the storage circuit. The combining circuit is arranged to output the first sub-parity code of the parity code as a beginning portion of the parity code, and output said at least one subsequent sub-parity code of the parity code as at least one subsequent portion of the parity code. Additionally, the memory controller writes the ECC chunk comprising the plurality of messages and the plurality of parity codes into the NV memory.

The present invention method and associated apparatus can guarantee that the memory device can operate properly in various situations without encountering the related art problems. For example, the NV memory write method provides multiple control schemes for access control. With aid of the present invention method and associated apparatus, the memory device will not suffer from the existing problems of the related art, such as the internal storage space problem, the increased cost problem, etc.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
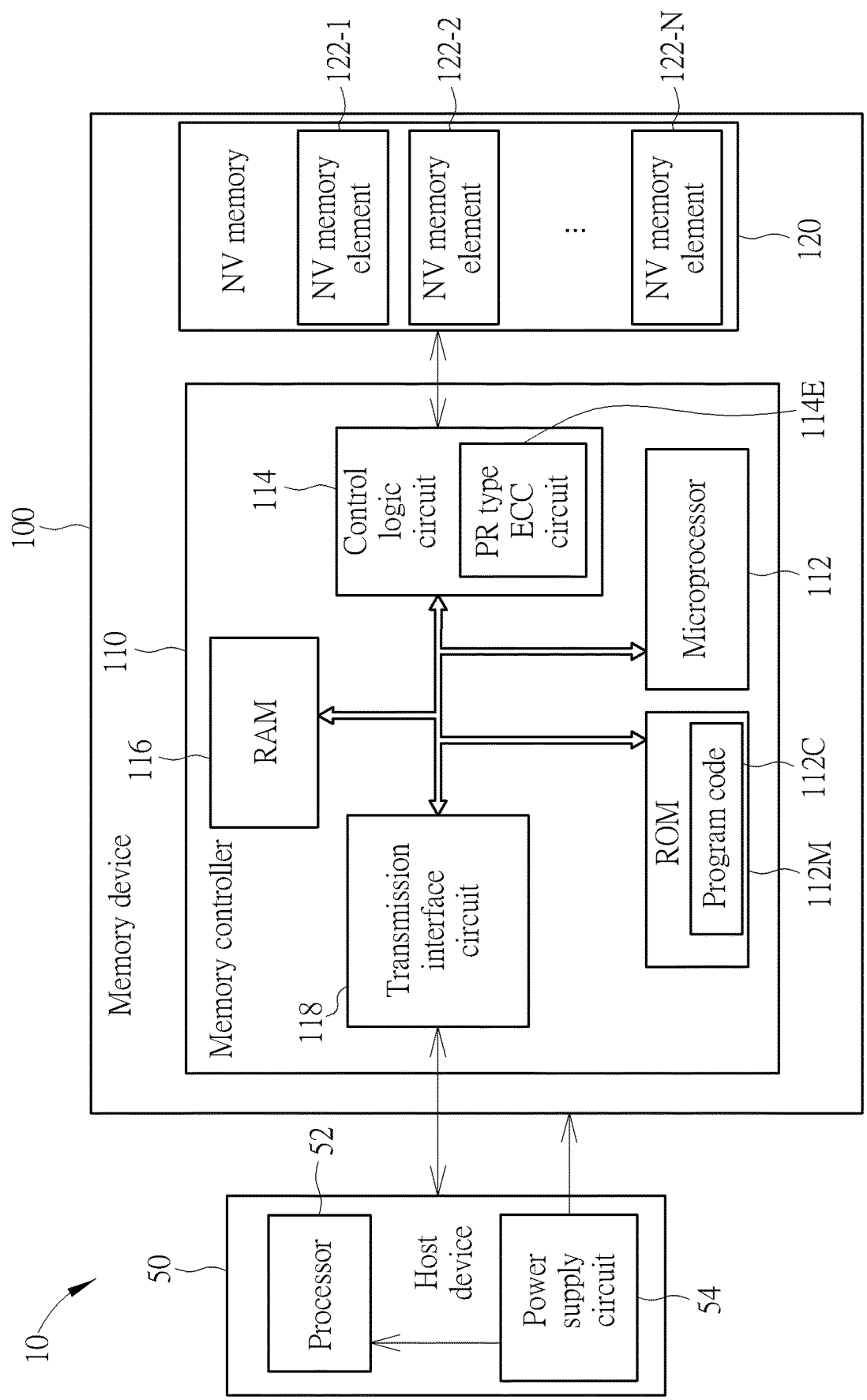
FIG. 1 is a diagram of an electronic system according to an embodiment of the present invention, where the electronic system may comprise a host device and a memory device.

FIG. 1 is a diagram of an electronic system 10 according to an embodiment of the present invention, where the electronic system 10 may comprise a host device 50 and a memory device 100. The host device 50 may comprise at least one processor (e.g. one or more processors) which may be collectively referred to as the processor 52, and may further comprise a power supply circuit 54 that is coupled to the processor 52. The processor 52 is arranged for controlling operations of the host device 50, and the power supply circuit 54 is arranged for providing power to the processor 52 and the memory device 100, and outputting one or more driving voltages to the memory device 100. The memory device 100 may be arranged for providing the host device 50 with storage space, and obtaining the one or more driving voltages from the host device 50 as power source of the memory device 100. Examples of the host device 50 may include, but are not limited to: a multifunctional mobile phone, a wearable device, a tablet computer, and a personal computer such as a desktop computer and a laptop computer. Examples of the memory device 100 may include, but are not limited to: a solid state drive (SSD), and an embedded storage device such as that conforming to Universal Flash Storage (UFS) or embedded MIVIC (eMMC) specifications. According to this embodiment, the memory device 100 may comprise a memory controller 110 and a non-volatile (NV) memory 120, where the memory controller 110 is arranged to control operations of the memory device 100 and access the NV memory 120, and the NV memory 120 is arranged to store information. The NV memory 120 may comprise at least one NV memory element (e.g. one or more NV memory elements), such as a plurality of NV memory elements 122-1, 122-2, ..., and 122-N, where "N" may represent a positive integer that is greater than one. For example, the NV memory 120 may be a flash memory, and the plurality of NV memory elements 122-1, 122-2, ..., and 122-N may be a plurality of flash memory chips or a plurality of flash memory dies, but the present invention is not limited thereto.

As shown in FIG. 1, the memory controller 110 may comprise a processing circuit such as a microprocessor 112, a storage unit such as a read-only memory (ROM) 112M, a control logic circuit 114, a random access memory (RAM) 116, and a transmission interface circuit 118, where the above components may be coupled to one another via a bus. The RAM 116 is implemented by a Static RAM (SRAM), but the present invention is not limited thereto. The RAM 116 may be arranged to provide the memory controller 110 with internal storage space. For example, the RAM 116 may be utilized as a buffer memory for buffering data. In addition, the ROM 112M of this embodiment is arranged to store a program code 112C, and the microprocessor 112 is arranged to execute the program code 112C to control the access of the NV memory 120. Note that, in some examples, the program code 112C may be stored in the RAM 116 or any type of memory. Further, the control logic circuit 114 may comprise a data protection circuit such as a pre-calculation information rotation type error correction code (ECC) circuit 114E (labeled "PR type ECC circuit" in FIG. 1, for brevity), and the data protection circuit such as the pre-calculation information rotation type ECC circuit 114E may protect data and/or perform error correction. The transmission interface circuit 118 may conform to a specific communications specification (e.g. UFS specification), and may perform communications according to the specific communications specification, for example, perform communications with the host device 50 for the memory device 100.

In this embodiment, the host device 50 may transmit host commands and corresponding logical addresses to the memory controller 110 to access the memory device 100. The memory controller 110 receives the host commands and the logical addresses, and translates the host commands into memory operating commands (which may be simply referred to as operating commands), and further controls the NV memory 120 with the operating commands to perform reading, writing/programming, etc. on memory units (e.g. data pages) having physical addresses within the NV memory 120, where the physical addresses may be associated with the logical addresses. When the memory controller 110 perform an erase operation on any NV memory element 122-n0 of the plurality of NV memory elements 122-1, 122-2, ..., and 122-N (in which "n0" may represent any integer in the interval [1, N]), at least one block of multiple blocks of the NV memory element 122-n0 may be erased, where each block of the blocks may comprise multiple pages (e.g. data pages), and an access operation (e.g. reading or writing) may be performed on one or more pages.

According to some embodiments, the memory device 100 may be implemented to be a memory card conforming to the SD/MMC, CF, MS, XD or UFS specifications, where the memory device 100 may be coupled to the host device 50 through an intermediate device such as a memory card reader, but the present invention is not limited thereto.

Figure 2:
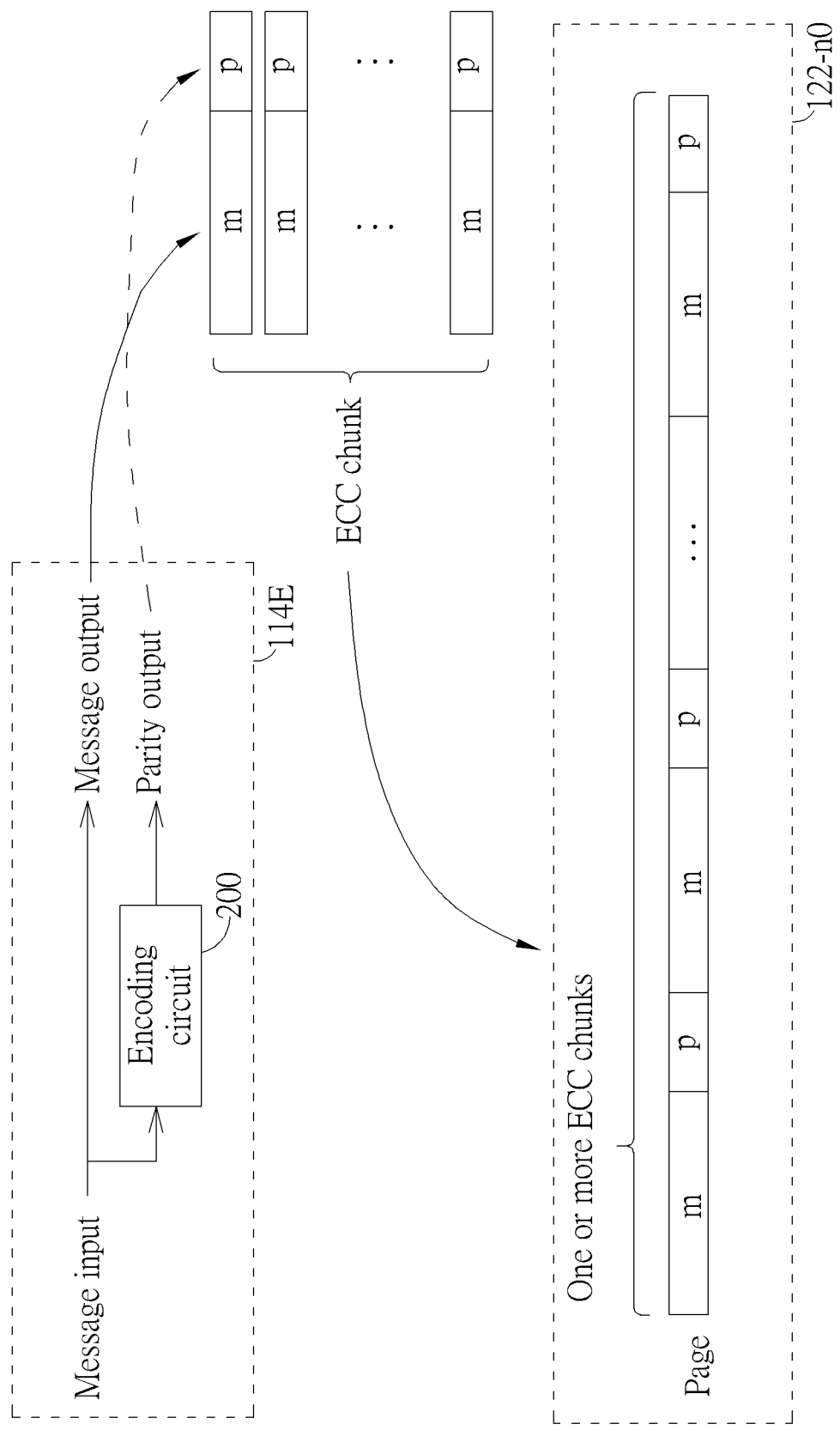
FIG. 2 illustrates some operations regarding error correction code (ECC) processing of the memory device shown in FIG. 1 and some associated components within the memory device according to an embodiment of the present invention.

FIG. 2 illustrates some operations regarding ECC processing of the memory device shown in FIG. 1 and some associated components within the memory device according to an embodiment of the present invention. The pre-calculation information rotation type ECC circuit 114E may comprise at least one encoding circuit (e.g. one or more encoding circuits) such as the encoding circuit 200 shown in FIG. 2, and the encoding circuit 200 may comprise at least one encoder (e.g. one or more encoders) such as a low-density parity-check (LDPC) encoder, but the present invention is not limited thereto. The pre-calculation information rotation type ECC circuit 114E may perform ECC processing on a plurality of messages to generate a plurality of parity codes during a write operation or a read operation, where each message of the plurality of messages comprises a set of message bits, and each parity code of the plurality of parity codes comprises a set of parity bits. Taking the write operation as an example, when any message of the plurality of messages is sent into the encoding circuit 200, the message input of the encoding circuit 200 and the message output may represent this message, and the parity output of the encoding circuit 200 may represent the parity code corresponding to this message. The pre-calculation information rotation type ECC circuit 114E may generate an ECC chunk comprising the plurality of messages and the plurality of parity codes (respectively labeled "m" and "p" in FIG. 2, for brevity) as a protection unit. For example, the ECC chunk may further comprise one or more other parity bits such as one or more rows of parity bits, for protecting the plurality of messages and the plurality of parity codes, where the one or more rows of parity bits may be attached to the rows of messages-parity code combinations within the ECC chunk shown in FIG. 2, but the present invention is not limited thereto. As shown in FIG. 2, the memory controller 110 may write or program one or more ECC chunks into a certain page in a certain block within the NV memory element 112-n. As the architecture of the NV memory 120 may vary depending on various design rules of NV memory manufacturers (e.g. Flash memory manufacturers), the number of ECC chunks in each page may vary correspondingly.

Based on the architecture shown in FIG. 1, the memory device 100 may store data for the host device 50, and the memory device 100 may write the data into the NV memory 120 in response to a host command such as a write command from the host device 50. During writing the data into the NV memory 120, the pre-calculation information rotation type ECC circuit 114E (e.g. the encoding circuit 200) may perform encoding to generate parity bits of a parity code to protect message bits of a message (e.g. any of the plurality of messages), where the message may correspond to a set of data within the data to be written into the NV memory 120. In addition, the memory device 100 may read the stored data in response to another host command such as a read command from the host device 50, and provide the host device 50 with the data read from the NV memory 120. During reading the stored data from the NV memory 120, the pre-calculation information rotation type ECC circuit 114E (e.g. the encoding circuit 200) may obtain a read out version of the message bits and a read out version of the parity bits. For example, the pre-calculation information rotation type ECC circuit 114E (e.g. the encoding circuit 200) may perform encoding on the read out version of the message bits to generate a non-read out version of the parity bits, and may determine whether the non-read out version of the parity bits and the read out version of the parity bits are the same to detect whether the read out version of the message bits is correct, but the present invention is not limited thereto.

When the non-read out version of the parity bits and the read out version of the parity bits are the same, the pre-calculation information rotation type ECC circuit 114E (e.g. the encoding circuit 200) may determine that the read out version of the message bits is correct. As a result, the memory controller 110 may utilize the read out version of the message bits as the set of data within the stored data from the NV memory 120, for being transmitted or returned to the host device 50. When there is any difference between the non-read out version of the parity bits and the read out version of the parity bits, the pre-calculation information rotation type ECC circuit 114E (e.g. the encoding circuit 200) may determine that the read out version of the message bits is incorrect, and perform error correction on the read out version of the message bits according to the read out version of the parity bits to generate a correct version of the message bits. As a result, the memory controller 110 may utilize the correct version of the message bits as the set of data within the stored data from the NV memory 120, for being transmitted or returned to the host device 50. Based on the architecture shown in FIG. 1, and more particularly, the operations regarding ECC processing as shown in FIG. 2, various errors of the data stored in the NV memory 120 can be prevented.

Figure 3:
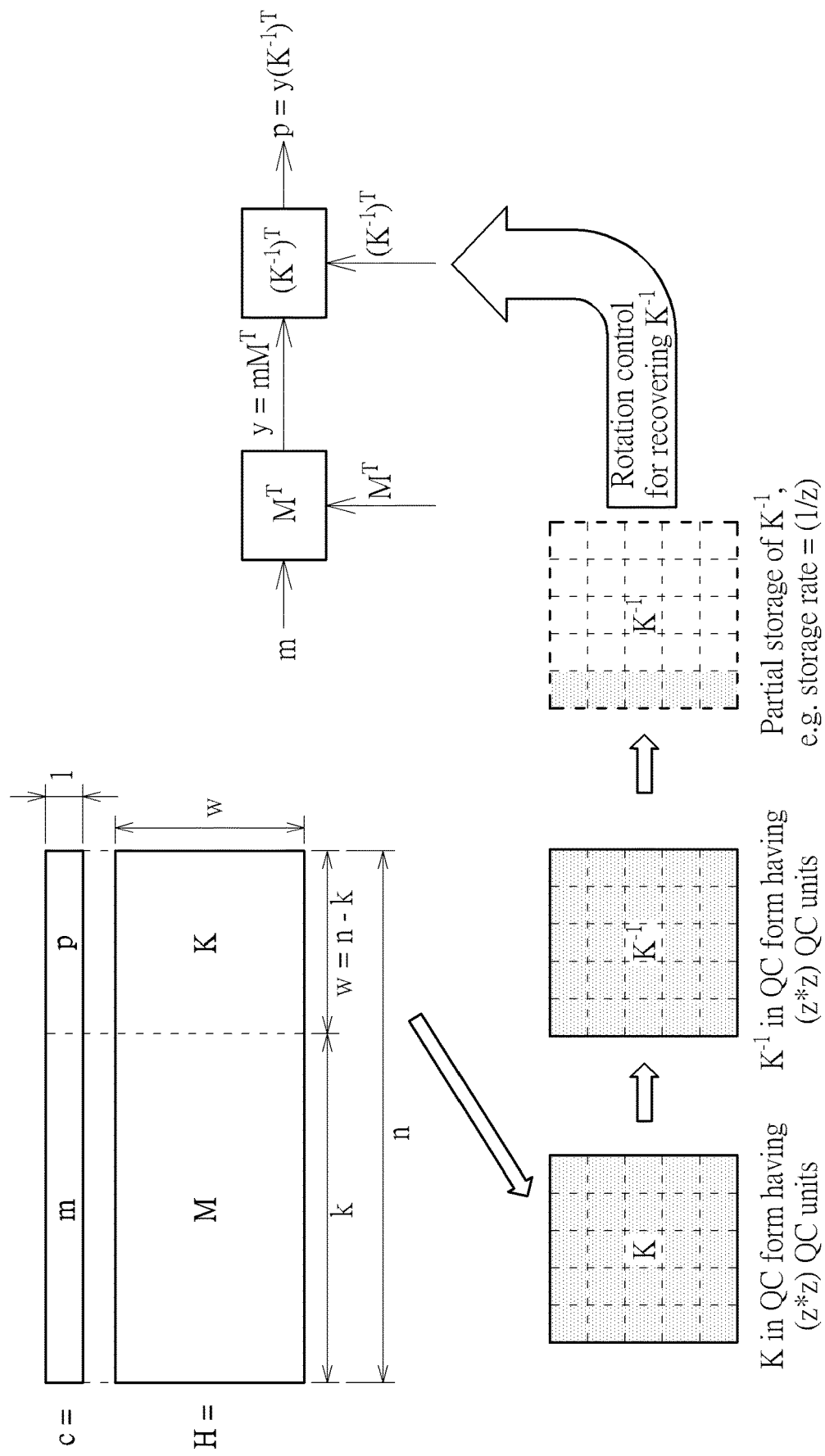
FIG. 3 illustrates a partial storage rotation control scheme of a non-volatile (NV) memory write method using data protection with aid of pre-calculation information rotation according to an embodiment of the present invention.

FIG. 3 illustrates a partial storage rotation control scheme of a NV memory write method using data protection with aid of pre-calculation information rotation according to an embodiment of the present invention, where the NV memory write method is applicable to the architecture shown in FIG. 1, and more particularly, the memory device 100, the memory controller 110, and the pre-calculation information rotation type ECC circuit 114E (e.g. the encoding circuit 200). For better comprehension, the memory controller 110 may receive a write command such as that mentioned above, and may receive the data corresponding to the write command (e.g. the aforementioned data to be written into the NV memory 120) from the host device 50. The encoding circuit 200 may obtain at least one portion of data (e.g. a plurality of sets of data, such as the set of data mentioned above) within the data corresponding to the write command to be the plurality of messages $\{m\}$ of the ECC chunk, to generate the plurality of parity codes $\{p\}$ of the ECC chunk according to the plurality of messages $\{m\}$ through pre-calculation information rotation type encoding of the encoding circuit 200, where the plurality of parity codes $\{p\}$ correspond to the plurality of messages $\{m\}$, respectively, for protecting the plurality of messages $\{m\}$, respectively. For example, the respective contents of the plurality of messages $\{m\}$ may vary depending on the contents of the data received from the host device 50. In addition, the memory controller 110 may write the ECC chunk comprising the plurality of messages $\{m\}$ and the plurality of parity codes $\{p\}$ into the NV memory 120. For example, regarding any message m within the plurality of messages $\{m\}$, operations of the pre-calculation information rotation type encoding may comprise: after at least one portion (e.g. a portion or all) of the message m is sent into the encoding circuit 200, the encoding circuit 200 starts encoding the message m to calculate a partial parity code y according to the message m and a transpose matrix $M^T$ of a part-one matrix M within a parity check matrix H, where the part-one matrix M is a first sub-matrix of the parity check matrix H; after at least one portion (e.g. a portion or all) of the partial parity code y is generated, the encoding circuit 200 loads a partial matrix $PM(K^{-1})$ of an inverse matrix $K^{-1}$ of a part-two matrix K within the parity check matrix H from a storage circuit within the encoding circuit 200, where the part-two matrix K is a second sub-matrix of the parity check matrix H, and the partial matrix $PM(K^{-1})$ of the inverse matrix $K^{-1}$ of the part-two matrix K is stored as pre-calculation information in the storage circuit; the encoding circuit 200 applies the partial matrix $PM(K^{-1})$ of the inverse matrix $K^{-1}$ of the part-two matrix K to the partial parity code y to generate a first sub-parity code (e.g. a sub-parity codes $p_1$) of the parity code p corresponding to the message m, and outputs the first sub-parity code (e.g. the sub-parity codes $p_1$) of the parity code p as a beginning portion of the parity code p; the encoding circuit 200 performs rotation control regarding the pre-calculation information to load at least one rotated version (e.g. one or more rotated versions) of the partial matrix $PM(K^{-1})$ of the inverse matrix $K^{-1}$ of the part-two matrix K; and the encoding circuit 200 applies the aforementioned at least one rotated version of the partial matrix $PM(K^{-1})$ of the inverse matrix $K^{-1}$ of the part-two matrix K to the partial parity code y to generate at least one subsequent sub-parity code (e.g. sub-parity codes $p_2$, $p_3$, etc.) of the parity code p, and outputs the aforementioned at least one subsequent sub-parity code (e.g. the sub-parity codes $p_2$, $p_3$, etc.) of the parity code p corresponding to the message m as at least one subsequent portion (e.g. one or more subsequent portions) of the parity code p.

For better comprehension, a codeword c comprising the message m and the parity code p, the parity check matrix H comprising the part-one matrix M and the part-two matrix K, and the inverse matrix $K^{-1}$ of the part-two matrix K within the parity check matrix H may be illustrated as shown in the left half of FIG. 3. The codeword c may be expressed with a 1-by-n matrix having a single row and n columns, where n may represent a positive integer. Within the codeword c, the message m may be expressed with a 1-by-k matrix having a single row and k columns, and the parity code p may be expressed with a 1-by-w matrix having a single row and w columns (e.g. w=n−k), where k and w may represent positive integers, respectively. In addition, the parity check matrix H may be expressed with a w-by-n matrix having w rows and n columns. Within the parity check matrix H, the part-one matrix M may be expressed with a w-by-k matrix having w rows and k columns, and the part-two matrix K may be expressed with a w-by-w matrix having w rows and w columns. Please note that parity check matrix H may be properly designed to enhance the coding performance. For example, in a situation where the Quasi-Cyclic (QC) LDPC code is adopted in the LDPC encoder of the encoding circuit 200, the part-two matrix K may be arranged in a QC form having (z*z) QC units, and any QC unit of the (z*z) QC units of the part-two matrix K may be a square matrix obtained from selectively shifting the matrix elements of an identity matrix $L_{(a \times a)}$ with a shifting amount SFT in a cyclic manner, where z may represent a positive integer greater than one (e.g. the case of z=5 may be illustrated for better comprehension), SFT may represent a non-negative integer (e.g. SFT≥0), and "a" in the subscript of the symbol of the identity matrix $L_{(a \times a)}$ may represent a positive integer (e.g. (a*z)=w). The inverse matrix $K^{-1}$ of the part-two matrix K may be in a QC form having (z*z) QC units, and any QC unit of the (z*z) QC units of the inverse matrix $K^{-1}$ may comprise matrix elements 0 and 1. More particularly, when a row (e.g. the first row) of this QC unit has a certain sequence of matrix elements 0 and 1, the next row of this row may have a shift version of the sequence, such as a shifted sequence generated by shifting the sequence in a cyclic manner, but the present invention is not limited thereto. As the shift relationship between this row and the next row may be repeated for any two adjacent rows (e.g. the second and the third rows, the third and the fourth rows, etc.) in the QC unit, the QC unit may be expressed with the sequence in a situation where this row is the first row of the QC unit, and therefore, storing the QC unit may be implemented by storing the sequence. When the proportions of the matrix elements 0 and 1 in the sequence are approximately the same, further reducing the data size of the QC unit by compressing the bit information of the sequence may be impractical or unworkable.

The contents of the part-one matrix M and the inverse matrix $K^{-1}$ of the part-two matrix K may be determined according to some predetermined rules of the manufacturer of the memory controller 110. For example, a portion of the part-one matrix M may be arranged to have one or more features similar to that of a portion of the part-two matrix K, but the present invention is not limited thereto. Although the part-one matrix M and the inverse matrix $K^{-1}$ may be prepared in advance, for use of encoding the message m to generate the parity code p, storing all of the contents of the part-one matrix M and the inverse matrix $K^{-1}$ may lead to high costs.

According to this embodiment, the part-two matrix K may be arranged to have a hierarchical QC structure, where the hierarchical QC structure of the part-two matrix K may allow the encoding circuit 200 to have partial storage of the inverse matrix $K^{-1}$, having no need to store the whole of the inverse matrix $K^{-1}$. Based on the hierarchical QC structure, the encoding circuit 200 may have the partial storage of the inverse matrix $K^{-1}$ (e.g. by merely storing a portion of the inverse matrix $K^{-1}$, rather than storing the whole of the inverse matrix $K^{-1}$, for use of encoding the message m to generate the parity code p) and perform the rotation control for recovering the inverse matrix $K^{-1}$ of the part-two matrix K, to perform the encoding (e.g. the operation of encoding the message m to generate the parity code p) according to the inverse matrix $K^{-1}$ recovered from the rotation control as shown in the right half of FIG. 3. For example, $y=mM^T$ and $p=y(K^{-1})^T$. As the transpose matrix $(K^{-1})^T$ of the inverse matrix $K^{-1}$ may be obtained from transposing the inverse matrix $K^{-1}$, and more particularly, by flipping the inverse matrix $K^{-1}$ over the diagonal of the inverse matrix $K^{-1}$, the transpose matrix $(K^{-1})^T$ may have the same matrix elements as that of the inverse matrix $K^{-1}$ except for the flipped arrangement due to flipping the inverse matrix $K^{-1}$ over the diagonal during transposing the inverse matrix $K^{-1}$. Therefore, the encoding circuit 200 may directly use the partial matrix $PM(K^{-1})$ of the inverse matrix $K^{-1}$ (e.g. a plurality of rows in the partial matrix $PM(K^{-1})$, such as row vectors therein) in a manner of the flipped arrangement to be the corresponding partial matrix within the transpose matrix $(K^{-1})^T$ (e.g. a plurality of columns in the corresponding partial matrix, such as column vectors therein), for example, through selecting any matrix element in the partial matrix $PM(K^{-1})$ as a corresponding matrix element in the corresponding partial matrix according to the flipped arrangement. In addition, based on the hierarchical QC structure, a storage rate per encoder regarding the inverse matrix $K^{-1}$ of the part-two matrix K in the encoding circuit 200 is less than one. For example, the storage rate per encoder may be equal to the storage rate of the inverse matrix $K^{-1}$ in the encoding circuit 200 for the encoder mentioned above, such as the ratio of the size $SIZE\_PM(K^{-1})$ of the storage space for storing the partial matrix $PM(K^{-1})$ of the inverse matrix $K^{-1}$ in the storage circuit within the encoding circuit 200 to the size $SIZE\_K^{-1}$ of the storage space for storing the whole of the inverse matrix $K^{-1}$ in an ordinary encoding circuit, and more particularly, may be equal to (1/z). For better comprehension, the case of z=5 may be illustrated as shown in the lower half of FIG. 3, but the present invention is not limited thereto. In this situation, the storage rate may be equal to (1/5).

Some implementation details regarding the relationships between the message m, the partial parity code y, and the parity code p may be described as follows:
Let cH=0;
$\Rightarrow mM^T + pK^T = 0$;
$\Rightarrow mM^T = pK^T$, where they are the same for the binary case;
Let y be the partial parity code, where $y=mM^T$;
$\Rightarrow y = pK^T$;
$\Rightarrow y(K^{-1})^T = pK^T(K^{-1})^T = p(K^{-1}K)^T = p(I)^T = p$;
where the part-one matrix M and the inverse matrix $K^{-1}$ may be pre-calculated, for being used during encoding, and at least one portion (e.g. a portion or all) of the part-one matrix M and at least one portion (e.g. a portion or all) of the inverse matrix $K^{-1}$ may be stored in the encoding circuit 200 in advance, for example, stored as hardware codes (e.g. ROM codes) within the pre-calculation information rotation type ECC circuit 114E during a production phase of the memory controller 110, but the present invention is not limited thereto. As shown in FIG. 3, in a situation where the encoding circuit 200 is equipped with the partial storage of the inverse matrix $K^{-1}$, the encoding circuit 200 may perform rotation control to recover the whole of the inverse matrix $K^{-1}$, and perform encoding according to the inverse matrix $K^{-1}$ recovered from the rotation control.

Figure 4:
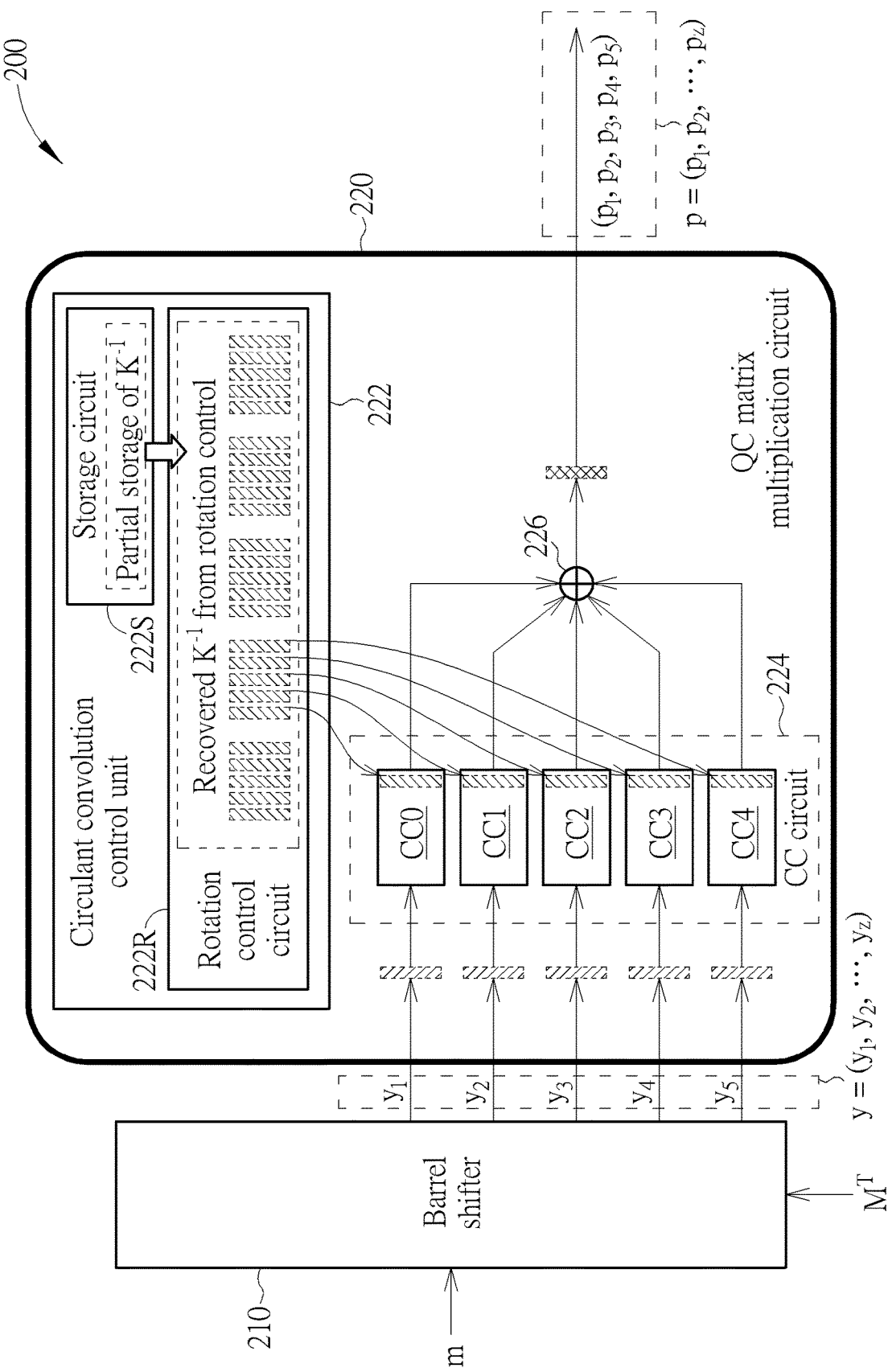
FIG. 4 is a diagram of an encoding circuit corresponding to the NV memory write method shown in FIG. 3 according to an embodiment of the present invention.

FIG. 4 is a diagram of the encoding circuit 200 corresponding to the NV memory write method shown in FIG. 3 according to an embodiment of the present invention, where the architecture shown in FIG. 4 may be taken as an example of an encoder within the aforementioned at least one encoder of the encoding circuit 200. The encoding circuit 200 (more particularly, this encoder) may comprise a barrel shifter 210 and a multiplication circuit such as a QC matrix multiplication circuit 220 coupled to the barrel shifter 210, and the QC matrix multiplication circuit 220 may comprise a circulant convolution control unit 222, a plurality of circulant convolution circuits 224 (labeled "CC circuit" for brevity) coupled to the circulant convolution control unit 222, and a combining circuit 226 that is coupled to the plurality of circulant convolution circuits 224, where the circulant convolution control unit 222 may comprise a storage circuit 222S and a rotation control circuit 222R coupled to the storage circuit 222S, and the plurality of circulant convolution circuits 224 may comprise z circulant convolution circuits such as the CC circuits CC0, CC1, etc. The storage circuit 222S may be implemented with a ROM, the rotation control circuit 222R may be implemented with logic circuits, and the combining circuit 226 may be implemented with an adder (e.g. a binary adder) such as an exclusive-OR (XOR) gate (labeled "+" in FIG. 4, for better comprehension), but the present invention is not limited thereto. For example, the rotation control circuit 222R may comprise counters, register circuits, and/or logic gates, and may perform the rotation control according to a clock signal. According to this embodiment, the barrel shifter 210 may perform partial parity code calculation, the QC matrix multiplication circuit 220 may perform multiplication to generate the parity code p corresponding to the message m. For example, the circulant convolution control unit 222 may perform circulant convolution control, the plurality of circulant convolution circuits 224 may perform circulant convolution, and the combining circuit 226 may combine and output the first sub-parity code (e.g. the sub-parity codes $p_1$) and the aforementioned at least one subsequent sub-parity code (e.g. the sub-parity codes $p_2$, $p_3$, etc.) as the beginning portion and the aforementioned at least one subsequent portion of the parity code p, respectively. In addition, the storage circuit 222S may store the pre-calculation information, and the rotation control circuit 222R may control the encoding circuit 200 to perform encoding with aid of pre-calculation information rotation for data protection during accessing the NV memory 120.

As shown in FIG. 4, the barrel shifter 210 may calculate the partial parity code y according to the message m and the transpose matrix $M^T$ during encoding the message m. For example, the barrel shifter 210 may multiply the message m by the transpose matrix $M^T$ to generate the partial parity code y, where the partial parity code y may comprise the sub-partial-parity codes $y_1, y_2, \ldots,$ and $y_z$ (e.g. $y=(y_1, y_2, \ldots, y_z)$). In addition, the multiplication circuit such as the QC matrix multiplication circuit 220 may apply a plurality of partial matrices $\{PM(K^{-1})\}$ such as z partial matrices $\{PM(K^{-1})_1, PM(K^{-1})_2, \ldots, PM(K^{-1})_z\}$ to the partial parity code y to generate the sub-parity codes $p_1, p_2, \ldots,$ and $p_z$ of the parity code p, respectively, where the parity code p may comprise the sub-parity codes $p_1, p_2, \ldots,$ and $p_z$ (e.g. $p=(p_1, p_2, \ldots, p_z)$). For example, the plurality of partial matrices $\{PM(K^{-1})\}$ may comprise the partial matrix $PM(K^{-1})_1$ that is stored as the pre-calculation information, such as the first QC unit column (e.g. the first column of QC units) in the QC form of the inverse matrix $K^{-1}$, and may comprise the subsequent partial matrices $\{PM(K^{-1})_2, \ldots, PM(K^{-1})_z\}$ that are recovered from the rotation control, such as the subsequent QC unit columns (e.g. the subsequent columns of QC units) in the QC form of the inverse matrix $K^{-1}$. For better comprehension, the case of z=5 may be illustrated as shown in the lower half of FIG. 4, but the present invention is not limited thereto. In this situation, the plurality of circulant convolution circuits 224 may comprise the CC circuits CC0, CC1, CC2, CC3, and CC4, the partial parity code y may comprise the sub-partial-parity codes $y_1, y_2, y_3, y_4,$ and $y_5$, and the parity code p may comprise the sub-parity codes $p_1, p_2, p_3, p_4,$ and $p_5$.

The storage circuit 222S may be taken as an example of the storage circuit mentioned in the embodiment shown in FIG. 3, and may provide the encoding circuit 200 with the partial storage of the inverse matrix $K^{-1}$ (labeled "Partial storage of $K^{-1}$" in FIG. 4, for brevity), for example, by merely storing the portion of the inverse matrix $K^{-1}$ (e.g. the partial matrix $PM(K^{-1})_1$ that is stored as the pre-calculation information), rather than storing the whole of the inverse matrix $K^{-1}$ (e.g. the z partial matrices $\{PM(K^{-1})_1, PM(K^{-1})_2, \ldots, PM(K^{-1})_z\}$). In the inverse matrix $K^{-1}$ that is recovered from the rotation control (labeled "Recovered $K^{-1}$ from rotation control" in FIG. 4, for brevity), the z partial matrices $\{PM(K^{-1})_1, PM(K^{-1})_2, \ldots, PM(K^{-1})_z\}$ may be illustrated as z set of vertical bars with each set thereof having z vertical bars (e.g. z=5), to indicate that the z partial matrices $\{PM(K^{-1})_1, PM(K^{-1})_2, \ldots, PM(K^{-1})_z\}$ are ready for being used as their) transpose matrices $\{PM(K^{-1})_1^T, PM(K^{-1})_2^T, \ldots, PM(K^{-1})_z^T\}$ according to the flipped arrangement, and the z QC units of any partial matrix of the z partial matrices $\{PM(K^{-1})_1, PM(K^{-1})_2, \ldots, PM(K^{-1})_z\}$ may be illustrated as the z vertical bars in the corresponding set of the z set of vertical bars (e.g. z=5), where the transpose matrices $\{PM(K^{-1})_1^T, PM(K^{-1})_2^T, \ldots, PM(K^{-1})_z^T\}$ are equal to the corresponding sub-matrices $\{PM(K^{-1})_1^T, PM(K^{-1})_2^T, \ldots, PM(K^{-1})_z^T\}$ of the transpose matrix $PM(K^{-1})^T$ of the partial matrix $PM(K^{-1})$, respectively. Some data paths or data flows from the circulant convolution control unit 222 to the plurality of circulant convolution circuits 224 may be illustrated as shown in FIG. 4, to indicate that the circulant convolution control unit 222 (e.g. the rotation control circuit 222R) may respectively load the z QC units in any partial matrix of the z partial matrices $\{PM(K^{-1})_1, PM(K^{-1})_2, \ldots, PM(K^{-1})_z\}$ into the z circulant convolution circuits $\{CC0, CC1, \ldots, CC(z-1)\}$ of the circulant convolution circuits 224, no matter whether this partial matrix is the partial matrix $PM(K^{-1})_1$ that is stored as the pre-calculation information or one of the subsequent partial matrices $\{PM(K^{-1})_2, \ldots, PM(K^{-1})_z\}$ that are recovered from the rotation control, but the present invention is not limited thereto.

According to this embodiment, the aforementioned at least one rotated version (e.g. one or more rotated versions) of the partial matrix $PM(K^{-1})$ of the inverse matrix $K^{-1}$ may comprise (z-1) rotated versions of the partial matrix $PM(K^{-1})$ of the inverse matrix $K^{-1}$. Based on the hierarchical QC structure, the (z-1) rotated versions of the partial matrix $PM(K^{-1})$ are equal to the remaining partial matrices such as the remaining QC unit columns (e.g. the remaining columns of QC units) in the QC form of the inverse matrix $K^{-1}$, respectively. The hierarchical QC structure may be properly designed to ensure that the partial storage of the inverse matrix $K^{-1}$ is sufficient for the encoding circuit 200 to perform the rotation control for recovering the inverse matrix $K^{-1}$. As a result, the encoding circuit 200 may perform encoding according to the inverse matrix $K^{-1}$ recovered from the rotation control to generate the parity code p.

Some implementation details regarding the hierarchical QC structure may be described as follows. According to some embodiments, the part-two matrix K may be arranged to comprise multiple layers of QC matrices, and each layer of the multiple layers of QC matrices may be quasi-cyclic. For example, a QC matrix of a layer (e.g. the first layer) within the multiple layers of QC matrices, such as the whole of the part-two matrix K, may comprise a set of QC matrices of another layer (e.g. the second layer) within the multiple layers of QC matrices. As a result of utilizing the inverse matrix $K^{-1}$ of the part-two matrix K having the hierarchical QC structure, the encoding circuit 200 can recover the inverse matrix $K^{-1}$ by performing the rotation control. For example, the part-two matrix K may be arranged to have the following hierarchical QC structure:

[[$QC_A$ $QC_B$ $QC_C$ $QC_D$ $QC_E$]
[$QC_E$ $QC_A$ $QC_B$ $QC_C$ $QC_D$]
[$QC_D$ $QC_E$ $QC_A$ $QC_B$ $QC_C$]
[$QC_C$ $QC_D$ $QC_E$ $QC_A$ $QC_B$]
[$QC_B$ $QC_C$ $QC_D$ $QC_E$ $QC_A$]], where $QC_A$, $QC_B$, $QC_C$, $QC_D$, and $QC_E$ may represent QC units, and any two QC units having the same symbol (e.g. any of $QC_A$, $QC_B$, $QC_C$, $QC_D$, and $QC_E$ in this hierarchical QC structure) may have the same contents, but the present invention is not limited thereto. According to some embodiments, the relationship between the layer (e.g. the first layer) and the other layer (e.g. the second layer) may be repeated for any two adjacent layers within the multiple layers of QC matrices. For example, a QC matrix of the other layer (e.g. the second layer) within the multiple layers of QC matrices may comprise a set of QC matrices of yet another layer (e.g. the third layer) within the multiple layers of QC matrices. For another example, the part-two matrix K is arranged to have the relationship between the first and the second layers and the relationship between the second and the third layers as described above, and the rest may be deduced by analogy. As a result of utilizing the inverse matrix $K^{-1}$ of the part-two matrix K having the hierarchical QC structure, the encoding circuit 200 can recover the inverse matrix $K^{-1}$ by performing the rotation control.

Figure 5:
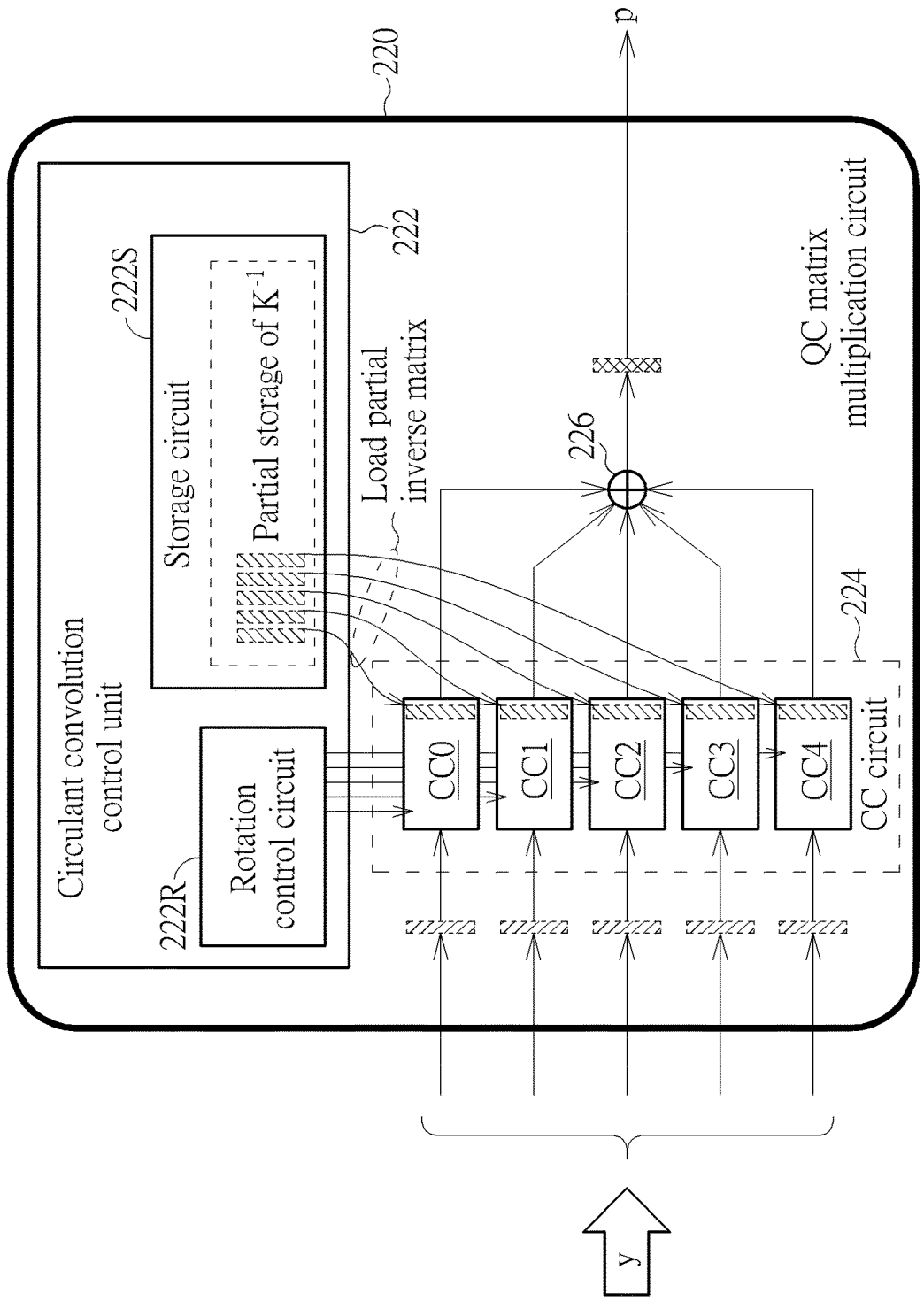
FIG. 5 illustrates a partial matrix rotation control scheme of the NV memory write method shown in FIG. 3 according to an embodiment of the present invention.
Figure 6:
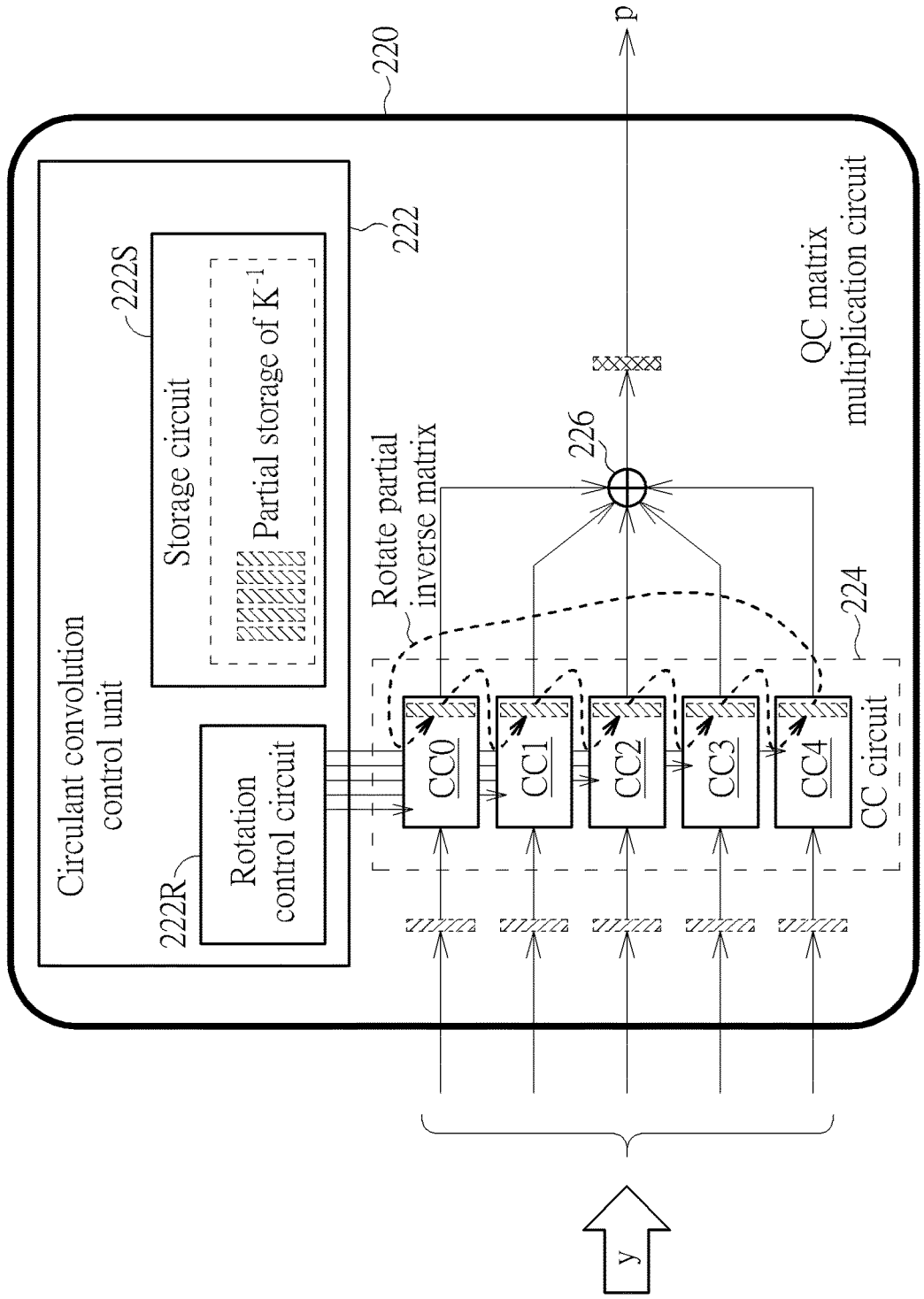
FIG. 6 illustrates some implementation details of the partial matrix rotation control scheme shown in FIG. 5.

FIG. 5 illustrates a partial matrix rotation control scheme of the NV memory write method shown in FIG. 3 according to an embodiment of the present invention, and FIG. 6 illustrates some implementation details of the partial matrix rotation control scheme shown in FIG. 5. After the partial parity code y is generated, under control of the circulant convolution control unit 222 (e.g. the rotation control circuit 222R), the QC matrix multiplication circuit 220 may load the partial matrix $PM(K^{-1})$ that is stored as the pre-calculation information, such as the partial matrix $PM(K^{-1})_1$, into the plurality of circulant convolution circuits 224 from the storage circuit 222S (labeled "Load partial inverse matrix" in FIG. 5, for brevity). In addition, the plurality of circulant convolution circuits 224 may apply the partial matrix $PM(K^{-1})_1$ to the partial parity code y to generate the first sub-parity code such as the sub-parity codes $p_1$, and output the sub-parity codes $p_1$ as the beginning portion of the parity code p. During applying the partial matrix $PM(K^{-1})_1$ to the partial parity code y, the plurality of circulant convolution circuits 224 may use the partial matrix $PM(K^{-1})_1$ as the transpose matrix $PM(K^{-1})_1^T$ of the partial matrix $PM(K^{-1})_1$ according to the flipped arrangement, and perform circulant convolution operations on the partial parity code y according to the transpose matrix $PM(K^{-1})_1^T$ (which is equal to the corresponding sub-matrix $PM(K^{-1})^T_1$ of the transpose matrix $PM(K^{-1})^T$ of the partial matrix $PM(K^{-1})$), to generate the sub-parity codes $p_1$ within the parity code p.

After the sub-parity codes $p_1$ is generated, under control of the circulant convolution control unit 222 (e.g. the rotation control circuit 222R), the QC matrix multiplication circuit 220 may perform the rotation control regarding the pre-calculation information, and more particularly, may rotate the z QC units of the partial matrix $PM(K^{-1})_1$ to generate the next partial matrix $PM(K^{-1})_2$ within the z partial matrices $\{PM(K^{-1})_1, PM(K^{-1})_2, \ldots, PM(K^{-1})_z\}$ (labeled "Rotate partial inverse matrix" in FIG. 6, for brevity). For example, the QC matrix multiplication circuit 220 may load the z QC units of the partial matrix $PM(K^{-1})_2$ into the circulant convolution circuits $\{CC0, CC1, \ldots, CC(z-1)\}$ from the respective previous circulant convolution circuits $\{CC(z-1), CC0, \ldots, CC(z-2)\}$ thereof through the rotation control, respectively. In addition, the plurality of circulant convolution circuits 224 may apply the partial matrix $PM(K^{-1})_2$ to the partial parity code y to generate the next sub-parity code such as the sub-parity codes $p_2$, and output the sub-parity codes $p_2$ as the next portion of the parity code p. During applying the partial matrix $PM(K^{-1})_2$ to the partial parity code y, the plurality of circulant convolution circuits 224 may use the partial matrix $PM(K^{-1})_2$ as the transpose matrix $PM(K^{-1})_2^T$ of the partial matrix $PM(K^{-1})_2$ according to the flipped arrangement, and perform circulant convolution operations on the partial parity code y according to the transpose matrix $PM(K^{-1})_2^T$ (which is equal to the corresponding sub-matrix $PM(K^{-1})^T_2$ of the transpose matrix $PM(K^{-1})^T$ of the partial matrix $PM(K^{-1})$), to generate the sub-parity codes $p_2$ within the parity code p.

The QC matrix multiplication circuit 220 may perform the rotation control in a similar manner to generate any partial matrix $PM(K^{-1})_{z1}$ within the $(z-1)$ partial matrices $\{PM(K^{-1})_2, \ldots, PM(K^{-1})_z\}$, and may apply the partial matrix $PM(K^{-1})_{z1}$ to the partial parity code y to generate and output the sub-parity codes $p_{z1}$, until generating the whole of the parity code p is completed, where z1 may represent an integer within the interval [2, z]. After the sub-parity codes $p_{z1-1}$ is generated, under control of the circulant convolution control unit 222 (e.g. the rotation control circuit 222R), the QC matrix multiplication circuit 220 may perform the rotation control regarding the pre-calculation information, and more particularly, may rotate the z QC units of the partial matrix $PM(K^{-1})_{z1-1}$ to generate the next partial matrix $PM(K^{-1})_{z1}$ within the z partial matrices $\{PM(K^{-1})_1, PM(K^{-1})_2, \ldots, PM(K^{-1})_z\}$ (labeled "Rotate partial inverse matrix" in FIG. 6, for brevity). For example, the QC matrix multiplication circuit 220 may load the z QC units of the partial matrix $PM(K^{-1})_{z1}$ into the circulant convolution circuits $\{CC0, CC1, \ldots, CC(z-1)\}$ from the respective previous circulant convolution circuits $\{CC(z-1), CC0, \ldots, CC(z-2)\}$ thereof through the rotation control, respectively. In addition, the plurality of circulant convolution circuits 224 may apply the partial matrix $PM(K^{-1})_{z1}$ to the partial parity code y to generate the next sub-parity code such as the sub-parity codes $p_{z1}$, and output the sub-parity codes $p_{z1}$ as the next portion of the parity code p. During applying the partial matrix $PM(K^{-1})_{z1}$ to the partial parity code y, the plurality of circulant convolution circuits 224 may use the partial matrix $PM(K^{-1})_{z1}$ as the transpose matrix $PM(K^{-1})_{z1}^T$ of the partial matrix $PM(K^{-1})_{z1}$ according to the flipped arrangement, and perform circulant convolution operations on the partial parity code y according to the transpose matrix $PM(K^{-1})_{z1}^T$ (which is equal to the corresponding sub-matrix $PM(K^{-1})^T_{z1}$ of the transpose matrix $PM(K^{-1})^T$ of the partial matrix $PM(K^{-1})$), to generate the sub-parity codes $p_{z1}$ within the parity code p.

Figure 7:
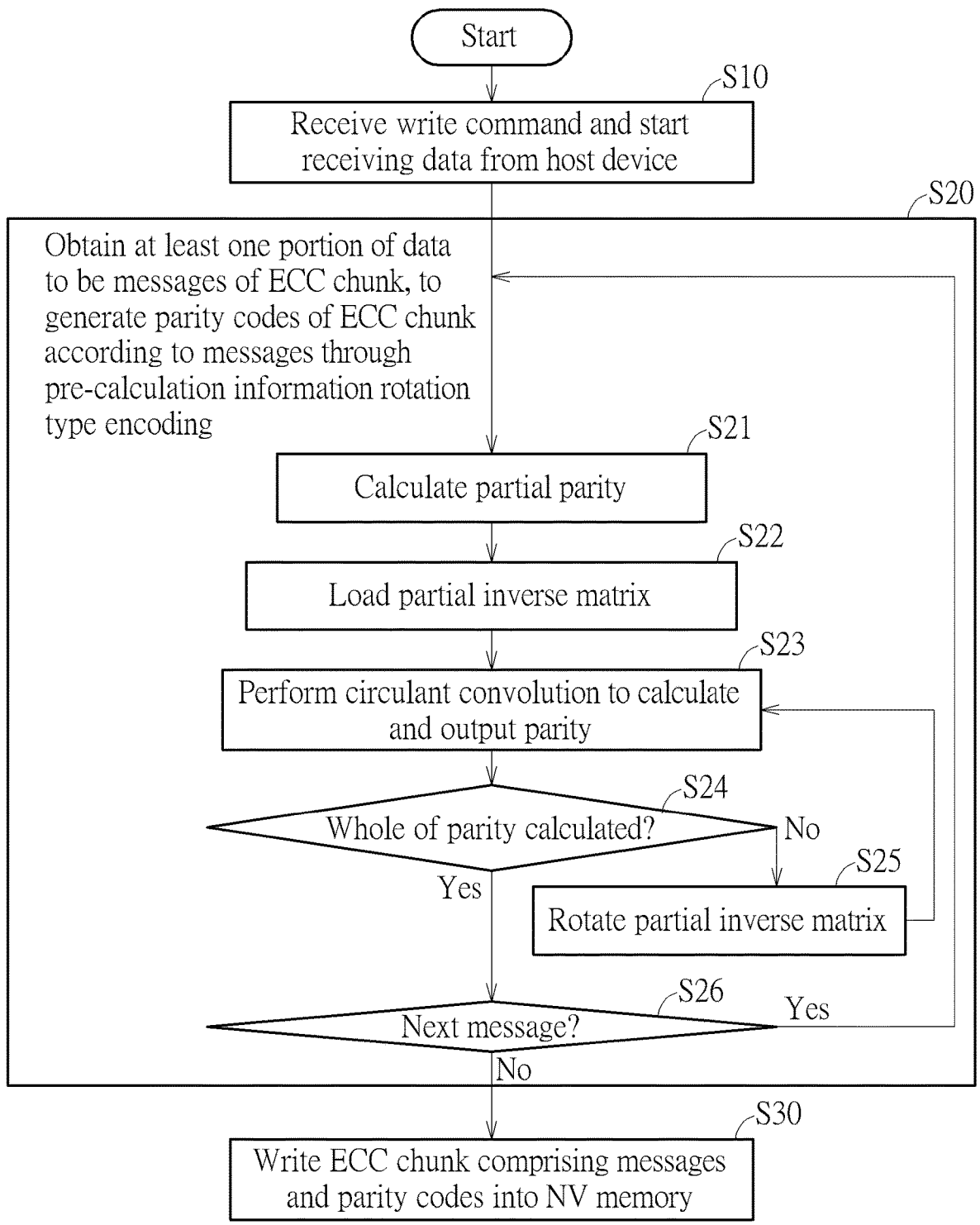
FIG. 7 illustrates a working flow of the partial matrix rotation control scheme shown in FIG. 5.

FIG. 7 illustrates a working flow of the partial matrix rotation control scheme shown in FIG. 5.

In Step S10, the memory controller 110 may receive the write command and start receiving the data corresponding to the write command (e.g. the aforementioned data to be written into the NV memory 120) from the host device 50.

In Step S20, the encoding circuit 200 may obtain the aforementioned at least one portion of data (e.g. the plurality of sets of data, such as the set of data mentioned above) to be the plurality of messages $\{m\}$ of the ECC chunk, to generate the plurality of parity codes $\{p\}$ of the ECC chunk according to the plurality of messages $\{m\}$ through the pre-calculation information rotation type encoding of the encoding circuit 200.

In Step S21, the encoding circuit 200 (e.g. the barrel shifter 210) may calculate the partial parity code y according to the message m and the transpose matrix $M^T$.

In Step S22, the encoding circuit 200 (e.g. the QC matrix multiplication circuit 220) may load the partial inverse matrix such as the partial matrix $PM(K^{-1})$ that is stored as the pre-calculation information (e.g. the partial matrix $PM(K^{-1})_1$) into the plurality of circulant convolution circuits 224 from the storage circuit 222S.

In Step S23, the encoding circuit 200 (e.g. the QC matrix multiplication circuit 220) may perform circulant convolution on the partial parity code y according to the currently loaded partial inverse matrix such as one of the z partial matrices $\{PM(K^{-1})_1, PM(K^{-1})_2, \ldots, PM(K^{-1})_z\}$ to calculate and output parity such as the corresponding sub-parity code of the sub-parity codes $p_1$, $p_2$, etc. of the parity code p.

In Step S24, the encoding circuit 200 (e.g. the QC matrix multiplication circuit 220) may determine whether the whole of the parity such as the parity code p is calculated. If yes (e.g. generating the whole of the parity code p is completed), Step 26 is entered; if no (e.g. generating the whole of the parity code p is not completed), Step 25 is entered In Step S25, the encoding circuit 200 (e.g. the QC matrix multiplication circuit 220) may rotate the partial inverse matrix, for example, rotate the z QC units of the partial matrix $PM(K^{-1})_{z1-1}$ to generate the next partial matrix $PM(K^{-1})_{z1}$ within the z partial matrices $\{PM(K^{-1})_1, PM(K^{-1})_2, \ldots, PM(K^{-1})_z\}$.

In Step S26, the encoding circuit 200 (e.g. the control circuit 210) may check whether processing a next message is required. When processing the next message is required Step S21 is entered; otherwise, Step S30 is entered.

In Step S30, the memory controller 110 may write the ECC chunk comprising the plurality of messages {m} and the plurality of parity codes {p} into the NV memory 120.

Additionally, during encoding the message m to generate the parity code p, Steps S23 and S24 may be executed z times, and the loop comprising Steps S23, S24, and S25 may be executed repeatedly until the whole of the parity such as the parity code p is calculated. For brevity, similar descriptions for this embodiment are not repeated in detail here.

For better comprehension, the NV memory write method may be illustrated with the working flow shown in FIG. 7, but the present invention is not limited thereto. According to some embodiments, one or more steps may be added, deleted, or changed in the working flow shown in FIG. 7.

Figure 8:
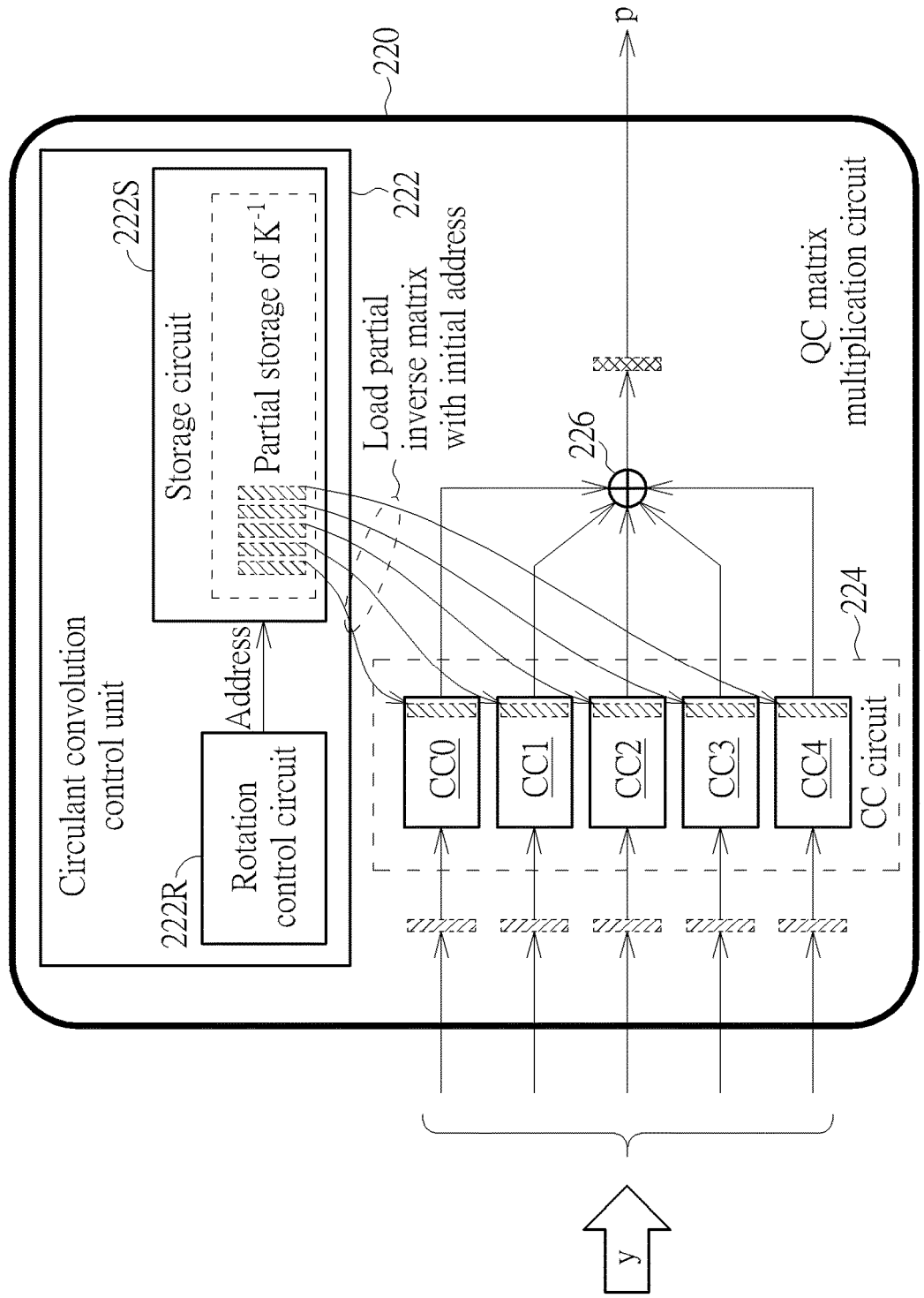
FIG. 8 illustrates a loading address rotation control scheme of the NV memory write method shown in FIG. 3 according to an embodiment of the present invention.
Figure 9:
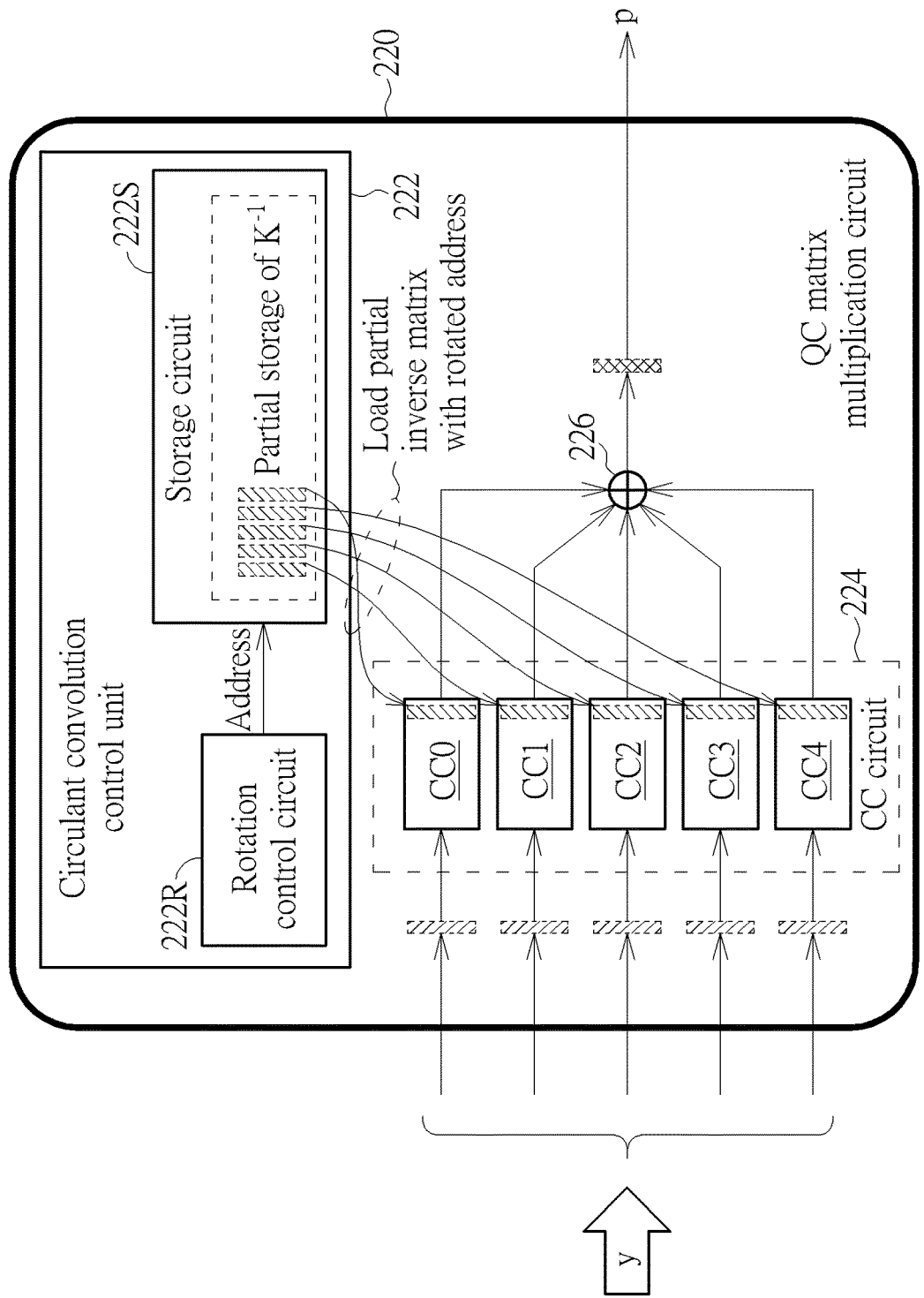
FIG. 9 illustrates some implementation details of the loading address rotation control scheme shown in FIG. 8.

FIG. 8 illustrates a loading address rotation control scheme of the NV memory write method shown in FIG. 3 according to an embodiment of the present invention, and FIG. 9 illustrates some implementation details of the loading address rotation control scheme shown in FIG. 8. The circulant convolution control unit 222 (e.g. the rotation control circuit 222R) may utilize a plurality of loading location addresses (which may be referred to as "loading addresses" hereinafter, for brevity) of the plurality of circulant convolution circuits 224 to indicate a plurality of loading locations (e.g. the z circulant convolution circuits such as the CC circuits CC0, CC1, etc.) for loading information into the plurality of circulant convolution circuits 224, respectively. For example, the loading addresses may comprise z loading addresses ADD(0), ADD(1), . . . , and ADD(z–1) pointing toward the z circulant convolution circuits {CC0, CC1, . . . , CC(z–1)} (e.g. {CC0, CC1, . . . , CC4} for the case of z=5), respectively. According to this embodiment, the circulant convolution control unit 222 (e.g. the rotation control circuit 222R) may perform the rotation control with respect to the loading address, and more particularly, may load any QC unit of the z QC units of the partial matrix $PM(K^{-1})$ that is stored as the pre-calculation information into any circulant convolution circuit of the z circulant convolution circuits {CC0, CC1, . . . , CC(z–1)} according to the corresponding loading address. For example, the circulant convolution control unit 222 may load this QC unit in to the circulant convolution circuit CC0 according to the loading address ADD(0) when there is a need; the circulant convolution control unit 222 may load this QC unit in to the circulant convolution circuit CC1 according to the loading address ADD(1) when there is a need; and the rest may be deduced by analogy. As a result, the QC matrix multiplication circuit 220 (e.g. the circulant convolution control unit 222) may utilize this QC unit as a certain QC unit of another partial matrix within the z partial matrices $\{PM(K^{-1})_1, PM(K^{-1})_2, \ldots, PM(K^{-1})_z\}$.

After the partial parity code y is generated, under control of the circulant convolution control unit 222 (e.g. the rotation control circuit 222R), the QC matrix multiplication circuit 220 may load the partial matrix $PM(K^{-1})$ that is stored as the pre-calculation information, such as the partial matrix $PM(K^{-1})_1$, into the plurality of circulant convolution circuits 224 from the storage circuit 222S according to a set of initial addresses such as the set of loading addresses {ADD(0), ADD(1), . . . , ADD(z–1)} (labeled "Load partial inverse matrix with initial address" in FIG. 8, for brevity). In addition, the plurality of circulant convolution circuits 224 may apply the partial matrix $PM(K^{-1})_1$ to the partial parity code y to generate the first sub-parity code such as the sub-parity codes $p_1$, and output the sub-parity codes $p_1$ as the beginning portion of the parity code p. During applying the partial matrix $PM(K^{-1})_1$ to the partial parity code y, the plurality of circulant convolution circuits 224 may use the partial matrix $PM(K^{-1})_1$ as the transpose matrix $PM(K^{-1})_1^T$ of the partial matrix $PM(K^{-1})_1$ according to the flipped arrangement, and perform circulant convolution operations on the partial parity code y according to the transpose matrix $PM(K^{-1})_1^T$ (which is equal to the corresponding sub-matrix $PM(K^{-1})^T_1$ of the transpose matrix $PM(K^{-1})^T$ of the partial matrix $PM(K^{-1})$), to generate the sub-parity codes $p_1$ within the parity code p.

After the sub-parity codes $p_1$ is generated, under control of the circulant convolution control unit 222 (e.g. the rotation control circuit 222R), the QC matrix multiplication circuit 220 may perform the rotation control regarding the pre-calculation information, and more particularly, may rotate the loading addresses corresponding to the partial matrix $PM(K^{-1})_1$ (e.g. the z QC units thereof) to generate the next partial matrix $PM(K^{-1})_2$ within the z partial matrices $\{PM(K^{-1})_1, PM(K^{-1})_2, \ldots, PM(K^{-1})_z\}$, for being loaded through a set of rotated addresses (e.g. a rotated version of the set of initial addresses). For example, the QC matrix multiplication circuit 220 may load the z QC units of the partial matrix $PM(K^{-1})_2$ into the circulant convolution circuits {CC0, CC1, . . . , CC(z–1)} within the plurality of circulant convolution circuits 224 from the storage circuit 222S according to the set of rotated addresses such as the set of loading addresses {ADD(1), . . . , ADD(z–2), ADD(z–1), ADD(0)} (labeled "Load partial inverse matrix with rotated address" in FIG. 9, for brevity). Through the rotation control with respect to the loading address, the QC matrix multiplication circuit 220 may load the z QC units of the partial matrix $PM(K^{-1})_2$ into the circulant convolution circuits {CC0, CC1, . . . , CC(z–1)} from the storage circuit 222S, as if loading the z QC units of the partial matrix $PM(K^{-1})_2$ into the circulant convolution circuits {CC0, CC1, . . . , CC(z–1)} from the respective previous circulant convolution circuits {CC(z–1), CC0, . . . , CC(z–2)} thereof as mentioned in the embodiment shown in FIG. 6. In addition, the plurality of circulant convolution circuits 224 may apply the partial matrix $PM(K^{-1})_2$ to the partial parity code y to generate the next sub-parity code such as the sub-parity codes $p_2$, and output the sub-parity codes $p_2$ as the next portion of the parity code p. During applying the partial matrix $PM(K^{-1})_2$ to the partial parity code y, the plurality of circulant convolution circuits 224 may use the partial matrix $PM(K^{-1})_2$ as the transpose matrix $PM(K^{-1})_2^T$ of the partial matrix $PM(K^{-1})_2$ according to the flipped arrangement, and perform circulant convolution operations on the partial parity code y according to the transpose matrix $PM(K^{-1})_2^T$ (which is equal to the corresponding sub-matrix $PM(K^{-1})^T_2$ of the transpose matrix $PM(K^{-1})^T$ of the partial matrix $PM(K^{-1})$), to generate the sub-parity codes $p_2$ within the parity code p.

The QC matrix multiplication circuit 220 may perform the rotation control in a similar manner to generate any partial matrix $PM(K^{-1})_{z1}$ within the (z–1) partial matrices $\{PM(K^{-1})_2, \ldots, PM(K^{-1})_z\}$, and may apply the partial matrix $PM(K^{-1})_{z1}$ to the partial parity code y to generate and output the sub-parity codes $p_{z1}$, until generating the whole of the parity code p is completed, where z1 may represent an integer within the interval [2, z]. After the sub-parity codes $p_{z1-1}$ is generated, under control of the circulant convolution control unit 222 (e.g. the rotation control circuit 222R), the QC matrix multiplication circuit 220 may perform the rotation control regarding the pre-calculation information, and more particularly, may rotate the loading addresses corresponding to the partial matrix $PM(K^{-1})_{z1-1}$ (e.g. the z QC units thereof) to generate the next partial matrix $PM(K^{-1})_{z1}$ within the z partial matrices $\{PM(K^{-1})_1, PM(K^{-1})_2, \ldots, PM(K^{-1})_z\}$, for being loaded through a set of rotated addresses (e.g. a rotated version of the set of initial addresses). For example, the QC matrix multiplication circuit 220 may load the z QC units of the partial matrix $PM(K^{-1})_{z1}$ into the circulant convolution circuits $\{CC0, CC1, \ldots, CC(z^{-1})\}$ within the plurality of circulant convolution circuits 224 from the storage circuit 222S according to the set of rotated addresses such as the $(z1)^{th}$ set of loading addresses within the z sets of loading addresses $\{ADD(0), ADD(1), \ldots, ADD(z-1)\}$, $\{ADD(1), \ldots, ADD(z-1), ADD(0)\}$, $\ldots$, and $\{ADD(z-1), ADD(0), \ldots, ADD(z-2)\}$ (labeled "Load partial inverse matrix with rotated address" in FIG. 9, for brevity). Through the rotation control with respect to the loading address, the QC matrix multiplication circuit 220 may load the z QC units of the partial matrix $PM(K^{-1})_{z1}$ into the circulant convolution circuits $\{CC0, CC1, \ldots, CC(z-1)\}$ from the storage circuit 222S, as if loading the z QC units of the partial matrix $PM(K^{-1})_{z1}$ into the circulant convolution circuits $\{CC0, CC1, \ldots, CC(z-1)\}$ from the respective previous circulant convolution circuits $\{CC(z-1), CC0, \ldots, CC(z-2)\}$ thereof as mentioned in the embodiment shown in FIG. 6. In addition, the plurality of circulant convolution circuits 224 may apply the partial matrix $PM(K^{-1})_{z1}$ to the partial parity code y to generate the next sub-parity code such as the sub-parity codes $p_{z1}$, and output the sub-parity codes $p_{z1}$ as the next portion of the parity code p. During applying the partial matrix $PM(K^{-1})_{z1}$ to the partial parity code y, the plurality of circulant convolution circuits 224 may use the partial matrix $PM(K^{-1})_{z1}$ as the transpose matrix $PM(K^{-1})_{z1}^T$ of the partial matrix $PM(K^{-1})_{z1}$ according to the flipped arrangement, and perform circulant convolution operations on the partial parity code y according to the transpose matrix $PM(K^{-1})_{z1}^T$ (which is equal to the corresponding sub-matrix $PM(K^{-1})_{z1}^T$ of the transpose matrix $PM(K^{-1})^T$ of the partial matrix $PM(K^{-1})$), to generate the sub-parity codes $p_{z1}$ within the parity code p.

Figure 10:
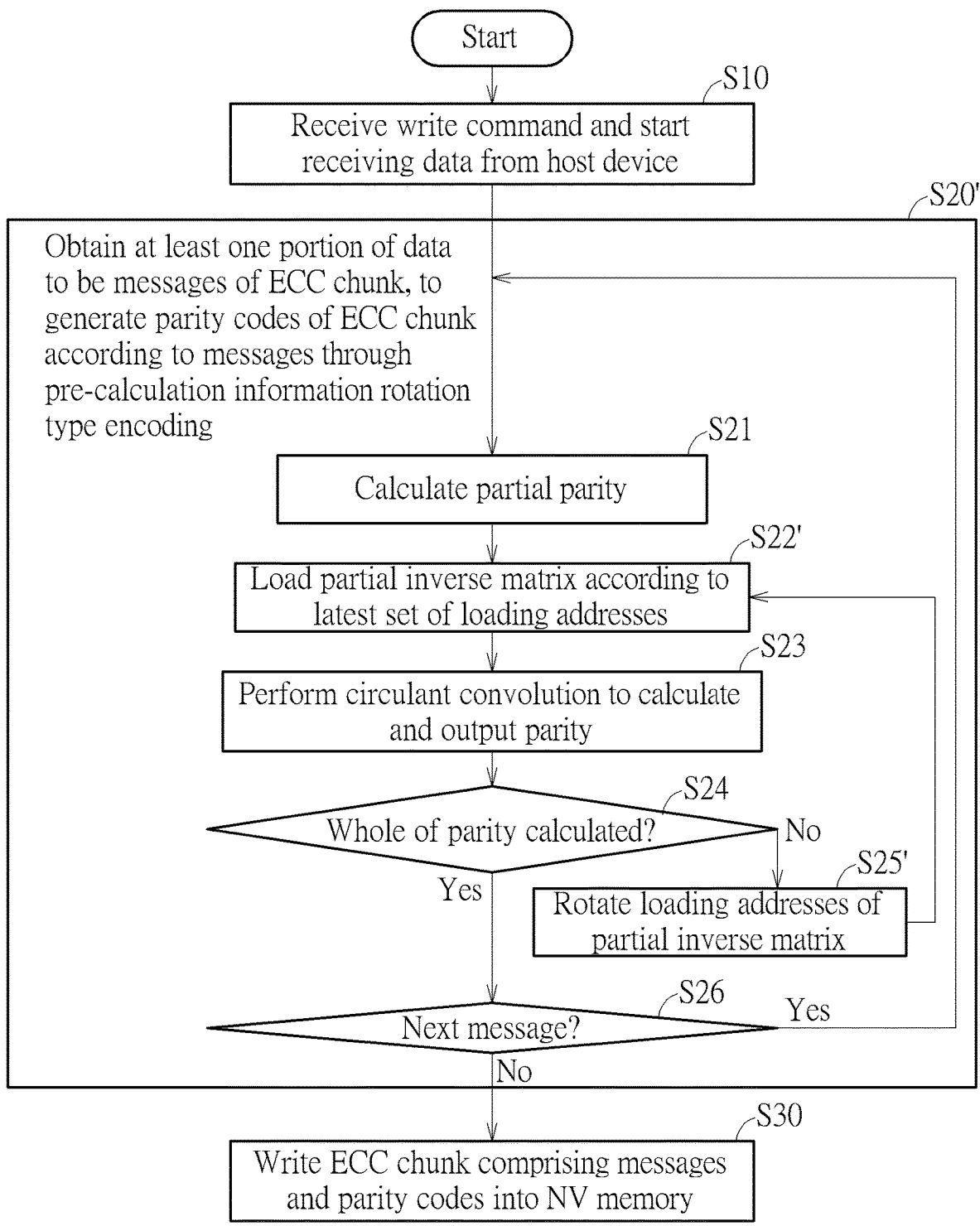
FIG. 10 illustrates a working flow of the loading address rotation control scheme shown in FIG. 8.

FIG. 10 illustrates a working flow of the loading address rotation control scheme shown in FIG. 8, where the working flow shown in FIG. 10 may be illustrated through changing the working flow shown in FIG. 7. For example, Steps S10, S21, S23, S24, S26, and S30 shown in FIG. 10 are the same as that shown in FIG. 7, respectively, and Steps S22' and S25' shown in FIG. 10 replace Steps S22 and S25 shown in FIG. 7, respectively. In response to the changes such as replacing Steps S22 and S25 by Steps S22' and S25', respectively, Step S20 may be renamed as Step S20' in this embodiment.

In Step S22', the encoding circuit 200 (e.g. the QC matrix multiplication circuit 220) may load the partial inverse matrix such as the partial matrix $PM(K^{-1})_{z0}$ (e.g. the $(z0)^{th}$ partial matrix within the z partial matrices $\{PM(K^{-1})_1, PM(K^{-1})_2, \ldots, PM(K^{-1})_z\}$) into the plurality of circulant convolution circuits 224 from the storage circuit 222S according to the latest set of loading addresses (e.g. the $(z0)^{th}$ set of loading addresses within the z sets of loading addresses $\{ADD(0), ADD(1), \ldots, ADD(z-1)\}$, $\{ADD(1), \ldots, ADD(z-1), ADD(0)\}, \ldots$, and $\{ADD(z-1), ADD(0), \ldots, ADD(z-2)\})$, where z0 may represent an integer within the interval [1, z].

In Step S25', the encoding circuit 200 (e.g. the QC matrix multiplication circuit 220) may rotate the loading addresses of the partial inverse matrix, such as the loading addresses corresponding to the partial matrix $PM(K^{-1})_{z0}$, to set the latest set of loading addresses to correspond to the next partial matrix $PM(K^{-1})_{z0+1}$ that is recovered through the rotation control.

Within the z sets of loading addresses $\{ADD(0), ADD(1), \ldots, ADD(z-1)\}$, $\{ADD(1), \ldots, ADD(z-1), ADD(0)\}, \ldots$, and $\{ADD(z-1), ADD(0), \ldots, ADD(z-2)\}$, the first set of loading addresses $\{ADD(0), ADD(1), \ldots, ADD(z-1)\}$ may be taken as an example of the set of initial addresses, and the other sets of loading addresses $\{ADD(1), \ldots, ADD(z-1), ADD(0)\}, \ldots$, and $\{ADD(z-1), ADD(0), \ldots, ADD(z-2)\}$ may be taken as examples of the set of rotated addresses. During encoding the message m to generate the parity code p, at the first time of executing Step S22' (e.g. z0=1), the latest set of loading addresses may represent the set of initial addresses such as the first set of loading addresses $\{ADD(0), ADD(1), \ldots, ADD(z-1)\}$, and the partial matrix $PM(K^{-1})_{z0}$ may represent the partial matrix $PM(K^{-1})$ that is stored as the pre-calculation information, such as the partial matrix $PM(K^{-1})_1$. In addition, during encoding the message m to generate the parity code p, at another time of executing Step S22' (e.g. z0>1), the latest set of loading addresses may represent the $(z0-1)^{th}$ set of rotated addresses such as the $(z0-1)^{th}$ set of loading addresses within the other sets of loading addresses $\{ADD(1), \ldots, ADD(z-1), ADD(0)\}, \ldots$, and $\{ADD(z-1), ADD(0), \ldots, ADD(z-2)\}$, and the partial matrix $PM(K^{-1})_{z0}$ may represent the $(z0-1)^{th}$ set partial matrix of the $(z-1)$ partial matrices $\{PM(K^1)_2, \ldots, PM(K^{-1})_z\}$.

According to this embodiment, the operation of Step S25' may comprise the rotation control with respect to the loading address as described in the embodiment shown in FIG. 9, such as the operation of rotating the loading addresses corresponding to the partial matrix $PM(K^{-1})_{z1-1}$ to generate the next partial matrix $PM(K^{-1})_{z1}$ within the z partial matrices $\{PM(K^{-1})_1, PM(K^{-1})_2, \ldots, PM(K^{-1})_z\}$, where the partial matrix $PM(K^{-1})_{z1-1}$ and the next partial matrix $PM(K^{-1})_{z1}$ mentioned above may be taken as examples of the partial matrix $PM(K^{-1})_{z0}$ and the next partial matrix $PM(K^{-1})_{z0+1}$ mentioned in Step S25', respectively. In addition, the operation of Step S22' may comprise the loading control as described in the embodiment shown in FIG. 9, such as the operation of loading the z QC units of the partial matrix $PM(K^{-1})_{z1}$ into the circulant convolution circuits $\{CC0, CC1, \ldots, CC(z-1)\}$ within the plurality of circulant convolution circuits 224 from the storage circuit 222S according to the set of rotated addresses, where the partial matrix $PM(K^{-1})_{z1}$ mentioned above (e.g. the partial matrix $PM(K^{-1})_{z1}$ having the z QC units being loaded) may be taken as examples of the partial matrix $PM(K^{-1})_z$ mentioned in Step S22', for example, for the cases of z0>1. Additionally, during encoding the message m to generate the parity code p, Steps S22', S23 and S24 may be executed z times, and the loop comprising Steps S22', S23, S24, and S25' may be executed repeatedly until the whole of the parity such as the parity code p is calculated. For brevity, similar descriptions for this embodiment are not repeated in detail here.

For better comprehension, the NV memory write method may be illustrated with the working flow shown in FIG. 10, but the present invention is not limited thereto. According to some embodiments, one or more steps may be added, deleted, or changed in the working flow shown in FIG. 10.

According to some embodiments, the aforementioned at least one encoder of the encoding circuit 200 may comprise a set of encoders, and the architecture shown in FIG. 4 may be taken as an example of any encoder in the set of encoders. For example, each encoder of the set of encoders may store the same part-one matrix M and the same inverse matrix $K^{-1}$. Assume that the number of encoders within the set of encoders is equal to b (e.g. b may represent a positive integer greater than two). Therefore, the size of the storage space regarding the inverse matrix $K^{-1}$ can be greatly reduced, for example, by a certain decrement such as a multiple $(b*((z-1)/z)*SIZE\_K^{-1})$ of the product $(((z-1)/z)*SIZE\_K^{-1})$ of the ratio $((z-1)/z)$ and the size $SIZE\_K^{-1}$ of the storage space for storing the whole of the inverse matrix $K^{-1}$, and the associated costs can be reduced correspondingly.

According to some embodiments, the aforementioned at least one encoder of the encoding circuit 200 may comprise multiple sets of encoders, and the architecture shown in FIG. 4 may be taken as an example of any encoder in any set of encoders within the multiple sets of encoders, where the multiple sets of encoders may correspond to the respective inverse matrices $\{K^{-1}\}$ of a plurality of parity check matrices $\{H\}$ regarding different ECC processing requirements. For example, each encoder of this set of encoders may store the same part-one matrix M and the same inverse matrix $K^{-1}$. Assume that the respective inverse matrices $\{K^{-1}\}$ of the plurality of parity check matrices $\{H\}$ comprises J inverse matrices $\{K^{-1}\}$ (e.g. J may represent a positive integer greater than one, and j may represent an integer within the interval [1, J]), and the number of encoders within the set of encoders corresponding to the inverse matrix $K^{-1}_j$ is equal to $b_j$ (e.g. $b_j$ may represent a positive integer greater than one). Therefore, the size of the storage space regarding the inverse matrix $K^{-1}$ can be greatly reduced, for example, by a greater decrement such as a summation $$\sum_{j=1,\ldots,J} \{(b_j*((z-1)/z)*SIZE\_K_j^{-1})\}$$

of the respective multiples $\{(b_j*((z-1)/z)*SIZE\_K^{-1}_j)\}$ of the respective products $\{(((z-1)/z)*SIZE\_K^{-1}_j)\}$ of the ratio $((z-1)/z)$ and the respective sizes $\{SIZE\_K^{-1}_j\}$ of the respective storage space for storing the whole of the J inverse matrices $\{K^{-1}_j\}$, and the associated costs can be reduced correspondingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A non-volatile (NV) memory write method using data protection with aid of pre-calculation information rotation, the NV memory write method being applicable to a memory controller of a memory device, the memory device comprising the memory controller and a NV memory, the NV memory comprising at least one NV memory element, the NV memory write method comprising:

utilizing the memory controller to receive a write command and data corresponding to the write command from a host device;

utilizing an encoding circuit of the memory controller to obtain at least one portion of data within the data corresponding to the write command to be a plurality of messages of an error correction code (ECC) chunk, to generate a plurality of parity codes of the ECO chunk according to the plurality of messages through pre-calculation information rotation type encoding, wherein the plurality of parity codes correspond to the plurality of messages, respectively, for protecting the plurality of messages, respectively, and regarding any message within the plurality of messages, the pre-calculation information rotation type encoding comprises:

after at least one portion of the message is sent into the encoding circuit, starting encoding the message to calculate a partial parity code according to the message and a transpose matrix of a part-one matrix within a parity check matrix, wherein the part-one matrix is a first sub-matrix of the parity check matrix;

after at least one portion of the partial parity code is generated, loading a partial matrix of an inverse matrix of a part-two matrix within the parity check matrix from a storage circuit within the encoding circuit, wherein the part-two matrix is a second sub-matrix of the parity check matrix, and the partial matrix of the inverse matrix of the part-two matrix is stored as pre-calculation information in the storage circuit;

applying the partial matrix of the inverse matrix of the part-two matrix to the partial parity code to generate a first sub-parity code of a parity code corresponding to the message, and outputting the first sub-parity code of the parity code as a beginning portion of the parity code;

performing rotation control regarding the pre-calculation information to load at least one rotated version of the partial matrix of the inverse matrix of the part-two matrix; and applying said at least one rotated version of the partial matrix of the inverse matrix of the part-two matrix to the partial parity code to generate at least one subsequent sub-parity code of the parity code corresponding to the message, and outputting said at least one subsequent sub-parity code of the parity code as at least one subsequent portion of the parity code; and utilizing the memory controller to write the ECC chunk comprising the plurality of messages and the plurality of parity codes into the NV memory.

2. The NV memory write method of claim 1, wherein the encoding circuit is equipped with partial storage of the inverse matrix of the part-two matrix.

3. The NV memory write method of claim 2, further comprising:

utilizing the memory controller to perform the rotation control for recovering the inverse matrix of the part-two matrix, to perform encoding according to the inverse matrix recovered from the rotation control, wherein the encoding comprises encoding the message to generate the parity code.

4. The NV memory write method of claim 1, further comprising:

utilizing the memory controller to merely store a portion of the inverse matrix of the part-two matrix, rather than storing a whole of the inverse matrix of the part-two matrix, for use of encoding the message to generate the parity code.

5. The NV memory write method of claim 4, further comprising:
utilizing the memory controller to perform the rotation control for recovering the inverse matrix of the part-two matrix, to perform encoding according to the inverse matrix recovered from the rotation control, wherein the encoding comprises encoding the message to generate the parity code.

6. The NV memory write method of claim 1, wherein a hierarchical Quasi-Cyclic (QC) structure of the part-two matrix allows the encoding circuit to have partial storage of the inverse matrix of the part-two matrix, having no need to store a whole of the inverse matrix of the part-two matrix.

7. The NV memory write method of claim 6, wherein based on the hierarchical QC structure, said at least one rotated version of the partial matrix of the inverse matrix of the part-two matrix is equal to at least one remaining partial matrix in a QC form of the inverse matrix of the part-two matrix.

8. The NV memory write method of claim 6, wherein regarding the hierarchical QC structure, the part-two matrix is arranged to comprise multiple layers of QC matrices, and each layer of the multiple layers of QC matrices is quasi-cyclic.

9. The NV memory write method of claim 6, wherein based on the hierarchical QC structure, a storage rate per encoder regarding the inverse matrix of the part-two matrix in the encoding circuit is less than one; and the storage rate per encoder is equal to a ratio of a size of storage space for storing the partial matrix of the inverse matrix of the part-two matrix in the storage circuit within the encoding circuit to a size of storage space for storing a whole of the inverse matrix.

10. The NV memory write method of claim 9, wherein the parity code comprises a number z of sub-parity codes comprising the first sub-parity code and said at least one subsequent sub-parity code, with z representing a positive integer greater than one, and said at least one subsequent sub-parity code comprises $(z-1)$ sub-parity codes; and the storage rate per encoder is equal to $(1/z)$.

11. The NV memory write method of claim 1, wherein the parity code comprises a number z of sub-parity codes comprising the first sub-parity code and said at least one subsequent sub-parity code, with z representing a positive integer greater than one, and said at least one subsequent sub-parity code comprises $(z-1)$ sub-parity codes; and a storage rate per encoder regarding the inverse matrix of the part-two matrix in the encoding circuit is equal to $(1/z)$.

12. The NV memory write method of claim 11, wherein said at least one rotated version of the partial matrix of the inverse matrix of the part-two matrix is equal to at least one remaining partial matrix of the inverse matrix of the part-two matrix; and said at least one rotated version of the partial matrix of the inverse matrix of the part-two matrix comprises $(z-1)$ rotated versions of the partial matrix of the inverse matrix of the part-two matrix, and said at least one remaining partial matrix of the inverse matrix of the part-two matrix comprises $(z-1)$ remaining partial matrices of the inverse matrix of the part-two matrix.

13. The NV memory write method of claim 12, further comprising:
performing the rotation control to generate the $(z-1)$ rotated versions of the partial matrix of the inverse matrix of the part-two matrix, for being used as the $(z-1)$ remaining partial matrices of the inverse matrix of the part-two matrix, to recover the inverse matrix of the part-two matrix.

14. A memory device, comprising:
a non-volatile (NV) memory, arranged to store information, wherein the NV memory comprises at least one NV memory element; and
a memory controller, coupled to the NV memory, arranged to control operations of the memory device, wherein the memory controller comprises:
a processing circuit, arranged to control the memory controller according to a plurality of host commands from a host device, to allow the host device to access the NV memory through the memory controller; and
a control logic circuit, coupled to the processing circuit, arranged to control the NV memory, wherein the control logic circuit comprises:
an encoding circuit, arranged to perform encoding with aid of pre-calculation information rotation for data protection during accessing the NV memory;
wherein:
the memory controller receives a write command and data corresponding to the write command from the host device;
the encoding circuit obtains at least one portion of data within the data corresponding to the write command to be a plurality of messages of an error correction code (ECC) chunk, to generate a plurality of parity codes of the ECC chunk according to the plurality of messages through pre-calculation information rotation type encoding, wherein the plurality of parity codes correspond to the plurality of messages, respectively, for protecting the plurality of messages, respectively, and regarding any message within the plurality of messages, operations of the pre-calculation information rotation type encoding comprise:
after at least one portion of the message is sent into the encoding circuit, the encoding circuit starts encoding the message to calculate a partial parity code according to the message and a transpose matrix of a part-one matrix within a parity check matrix, wherein the part-one matrix is a first sub-matrix of the parity check matrix;
after at least one portion of the partial parity code is generated, the encoding circuit loads a partial matrix of an inverse matrix of a part-two matrix within the parity check matrix from a storage circuit within the encoding circuit, wherein the part-two matrix is a second sub-matrix of the parity check matrix, and the partial matrix of the inverse matrix of the part-two matrix is stored as pre-calculation information in the storage circuit;
the encoding circuit applies the partial matrix of the inverse matrix of the part-two matrix to the partial parity code to generate a first sub-parity code of a parity code corresponding to the message, and outputs the first sub-parity code of the parity code as a beginning portion of the parity code;
the encoding circuit performs rotation control regarding the pre-calculation information to load at least one rotated version of the partial matrix of the inverse matrix of the part-two matrix; and
the encoding circuit applies said at least one rotated version of the partial matrix of the inverse matrix of the part-two matrix to the partial parity code to generate at least one subsequent sub-parity code of the parity code corresponding to the message, and outputs said at least one subsequent sub-parity code of the parity code as at least one subsequent portion of the parity code; and the memory controller writes the ECC chunk comprising the plurality of messages and the plurality of parity codes into the NV memory.

15. The memory device of claim 14, wherein the encoding circuit is equipped with partial storage of the inverse matrix of the part-two matrix.

16. The memory device of claim 15, wherein the memory controller performs the rotation control for recovering the inverse matrix of the part-two matrix, to perform encoding according to the inverse matrix recovered from the rotation control, wherein the encoding comprises encoding the message to generate the parity code.

17. The memory device of claim 14, wherein the memory controller merely stores a portion of the inverse matrix of the part-two matrix, rather than storing a whole of the inverse matrix of the part-two matrix, for use of encoding the message to generate the parity code.

18. The memory device of claim 17, wherein the memory controller performs the rotation control for recovering the inverse matrix of the part-two matrix, to perform encoding according to the inverse matrix recovered from the rotation control, wherein the encoding comprises encoding the message to generate the parity code.

19. A memory controller of a memory device, the memory device comprising the memory controller and a non-volatile (NV) memory, the NV memory comprising at least one NV memory element, the memory controller comprising:

a processing circuit, arranged to control the memory controller according to a plurality of host commands from a host device, to allow the host device to access the NV memory through the memory controller; and a control logic circuit, coupled to the processing circuit, arranged to control the NV memory, wherein the control logic circuit comprises:

an encoding circuit, arranged to perform encoding with aid of pre-calculation information rotation for data protection during accessing the NV memory;

wherein:

the memory controller receives a write command and data corresponding to the write command from the host device;

the encoding circuit obtains at least one portion of data within the data corresponding to the write command to be a plurality of messages of an error correction code (ECC) chunk, to generate a plurality of parity codes of the ECC chunk according to the plurality of messages through pre-calculation information rotation type encoding, wherein the plurality of parity codes correspond to the plurality of messages, respectively, for protecting the plurality of messages, respectively, and regarding any message within the plurality of messages, operations of the pre-calculation information rotation type encoding comprise:

after at least one portion of the message is sent into the encoding circuit, the encoding circuit starts encoding the message to calculate a partial parity code according to the message and a transpose matrix of a part-one matrix within a parity check matrix, wherein the part-one matrix is a first sub-matrix of the parity check matrix;

after at least one portion of the partial parity code is generated, the encoding circuit loads a partial matrix of an inverse matrix of a part-two matrix within the parity check matrix from a storage circuit within the encoding circuit, wherein the part-two matrix is a second sub-matrix of the parity check matrix, and the partial matrix of the inverse matrix of the part-two matrix is stored as pre-calculation information in the storage circuit;

the encoding circuit applies the partial matrix of the inverse matrix of the part-two matrix to the partial parity code to generate a first sub-parity code of a parity code corresponding to the message, and outputs the first sub-parity code of the parity code as a beginning portion of the parity code;

the encoding circuit performs rotation control regarding the pre-calculation information to load at least one rotated version of the partial matrix of the inverse matrix of the part-two matrix; and the encoding circuit applies said at least one rotated version of the partial matrix of the inverse matrix of the part-two matrix to the partial parity code to generate at least one subsequent sub-parity code of the parity code corresponding to the message, and outputs said at least one subsequent sub-parity code of the parity code as at least one subsequent portion of the parity code; and the memory controller writes the ECC chunk comprising the plurality of messages and the plurality of parity codes into the NV memory.

20. An encoding circuit of a memory controller of a memory device, the memory device comprising the memory controller and a non-volatile (NV) memory, the memory controller comprising the encoding circuit, the NV memory comprising at least one NV memory element, the encoding circuit comprising:

a barrel shifter, arranged to perform partial parity code calculation, wherein the memory controller receives a write command and data corresponding to the write command from a host device, and the encoding circuit obtains at least one portion of data within the data corresponding to the write command to be a plurality of messages of an error correction code (ECC) chunk, to generate a plurality of parity codes of the ECC chunk according to the plurality of messages through pre-calculation information rotation type encoding, wherein the plurality of parity codes correspond to the plurality of messages, respectively, for protecting the plurality of messages, respectively, and after at least one portion of any message within the plurality of messages is sent into the encoding circuit, the barrel shifter calculates a partial parity code according to the message and a transpose matrix of a part-one matrix within a parity check matrix, wherein the part-one matrix is a first sub-matrix of the parity check matrix; and a multiplication circuit, coupled to the barrel shifter, arranged to perform multiplication to generate a parity code corresponding to the message, wherein the multiplication circuit comprises:

a circulant convolution control unit, comprising:

a storage circuit, arranged to store pre-calculation information; and a rotation control circuit, coupled to the storage circuit, arranged to control the encoding circuit to perform encoding with aid of pre-calculation information rotation for data protection during accessing the NV memory;

a plurality of circulant convolution circuits, coupled to the circulant convolution control unit, arranged to perform circulant convolution, wherein after at least one portion of the partial parity code is generated, the rotation control circuit loads a partial matrix of an inverse matrix of a part-two matrix within the parity check matrix from the storage circuit, to allow the plurality of circulant convolution circuits to apply the partial matrix of the inverse matrix of the part-two matrix to the partial parity code to generate a first sub-parity code of the parity code corresponding to the message, and performs rotation control regarding the pre-calculation information to load at least one rotated version of the partial matrix of the inverse matrix of the part-two matrix, to allow the plurality of circulant convolution circuits to apply said at least one rotated version of the partial matrix of the inverse matrix of the part-two matrix to the partial parity code to generate at least one subsequent sub-parity code of the parity code corresponding to the message, wherein the part-two matrix is a second sub-matrix of the parity check matrix, and the partial matrix of the inverse matrix of the part-two matrix is stored as the pre-calculation information in the storage circuit; and a combining circuit, coupled to the plurality of circulant convolution circuits, arranged to output the first sub-parity code of the parity code as a beginning portion of the parity code, and output said at least one subsequent sub-parity code of the parity code as at least one subsequent portion of the parity code;

wherein the memory controller writes the ECC chunk comprising the plurality of messages and the plurality of parity codes into the NV memory.

\* \* \* \* \*